(12) United States Patent
Suaya et al.

(10) Patent No.: US 7,426,706 B2
(45) Date of Patent: Sep. 16, 2008

(54) SYNTHESIS STRATEGIES BASED ON THE APPROPRIATE USE OF INDUCTANCE EFFECTS

(76) Inventors: Roberto Suaya, 8 Allee de la Rosearaie, 38240 Meylan (FR); Rafael Escovar, 26 Rue Emile Gueymard, 38000 Grenoble (FR)

( * ) Notice: Subject to any disclaimer, the term of this patent is extended or adjusted under 35 U.S.C. 154(b) by 0 days.

(21) Appl. No.: 11/359,135

(22) Filed: Feb. 21, 2006

(65) Prior Publication Data
US 2006/0143586 A1   Jun. 29, 2006

Related U.S. Application Data

(63) Continuation of application No. 10/293,900, filed on Nov. 12, 2002, now Pat. No. 7,013,442.

(60) Provisional application No. 60/374,208, filed on Apr. 19, 2002, provisional application No. 60/335,157, filed on Nov. 13, 2001.

(51) Int. Cl.
*G06F 17/50* (2006.01)
(52) U.S. Cl. ................. 716/6; 716/10; 716/11
(58) Field of Classification Search ............ 716/2, 716/4–6, 10–14, 18
See application file for complete search history.

(56) References Cited

U.S. PATENT DOCUMENTS 6,053,950 A     4/2000  Shinagawa
6,058,256 A *   5/2000  Mellen et al. ............. 716/12
6,205,571 B1 *  3/2001  Camporese et al. ........ 716/2

(Continued)

FOREIGN PATENT DOCUMENTS

JP       11-274308        10/1999

(Continued)

OTHER PUBLICATIONS

Mankoo Lee, Anthony Hill, and Merrick Darly (Interconnect Inductance Effects on Delay and Crosstalks for Long On-Chip Nets with Fast Input Slew Rates, Digital Compression Product, Texas Instrument (Circuits and Systems, 1998. ISCAS '98. Proceedings of the 1998 IEEE International Symposium on, vol. 2, May 31-Jun. 3, 1998, pp. 248-251 vol. 2).*

(Continued)

*Primary Examiner*—Paul Dinh
(74) *Attorney, Agent, or Firm*—Klarquist Sparkman, LLP

(57) ABSTRACT

A method of optimizing the signal propagation speed on a wiring layout is provided. In general, the method accounts for and uses inductance effects caused by the propagation of a high-speed signal on a signal wire surrounded by parallel ground wires. In particular, one of the physical parameters defining the wiring layout may be adjusted to create an rlc relationship in the wiring layout that maximizes the signal propagation speed. The physical parameter that is adjusted may be, for example, the wire separation between the signal wire and the ground wires or the width of the ground wires. The disclosed method may also be applied to a wiring layout having multiple branches, such as a clock tree. In this context, a first branch may be optimized using the disclosed method. Downstream branches may then be adjusted so that the impedances at the junction between the branches are substantially equal.

25 Claims, 21 Drawing Sheets

U.S. PATENT DOCUMENTS

| | | |
|---|---|---|
| 6,295,634 B1 | 9/2001 | Matsumoto |
| 6,311,313 B1 | 10/2001 | Camporese et al. |
| 6,327,696 B1 | 12/2001 | Mahajan |
| 6,378,080 B1 | 4/2002 | Anjo et al. |
| 6,381,730 B1 | 4/2002 | Chang et al. |
| 6,434,724 B1 * | 8/2002 | Chang et al. ............ 716/4 |
| 6,453,444 B1 | 9/2002 | Shepard |
| 6,487,703 B1 | 11/2002 | McBride et al. |
| 6,578,174 B2 | 6/2003 | Zizzo |
| 6,643,831 B2 | 11/2003 | Chang et al. |
| 6,651,230 B2 | 11/2003 | Cohn et al. |
| 6,742,165 B2 | 5/2004 | Lev et al. |
| 7,013,442 B2 | 3/2006 | Suaya et al. |
| 2002/0116696 A1 | 8/2002 | Suaya et al. |
| 2005/0268260 A1 | 12/2005 | Suaya et al. |
| 2006/0143586 A1 | 6/2006 | Suaya et al. |

FOREIGN PATENT DOCUMENTS

| | | |
|---|---|---|
| JP | 2000-132975 | 5/2000 |

OTHER PUBLICATIONS

Xiaoning Qi: On-Chip Inductance Modeling of VLSI Interconnects, 2000 IEEE International Solid State Circuit Conference.*
Norman Chang: Clock tree RLC extraction with Efficient Inductance Modeling, ACM 2000.*
Yi Chang Lu: Min/Max on-chip Inductance models and delay Metric, DAC 2001, Jun. 18-22, Las Vegas, Nevada, USA, 2001 ACM.*
Averill III, et al., "Chip integration methodology for the IBM S/390 G5 and G6 custom microprocessors," *IBM J. Res. Develop*, vol. 43, pp. 681-706 (Sep./Nov. 1999).
Banerjee et al., "Accurate Analysis of On-Chip Inductance Effects and Implications for Optimal Repeater Insertion and Technology Scaling," *IEEE Symp. on VLSI Circuits*, pp. 1-4 (Jun. 14-16, 2001).
Chang et al., "Clocktree RLC Extraction with Efficient Inductance Modeling," *Hewlett-Packard Laboratories/ECE Dept., University of Wisconsin*, 5 pp. (2000).
Davis et al., "Compact Distributed RLC Interconnect Models—Part I: Single Line Transient, Time Delay, and Overshoot Expressions," *IEEE Trans. Electron Devices*, vol. 47, No. 11, pp. 2068-2077 (Nov. 2000).
Gala et al., "Inductance 101: Analysis and Design Issues," *IEEE Design Automation Conf.*, pp. 329-334 (June 2001).
Gieseke et al., "A 600 MHz Superscalar RISC Microprocessor with Out-Of-Order Execution," *IEEE International Solid-State Circuits Conference*, pp. 176, 177 and 451 (Feb. 1997).
Golub et al., "The Differentiation of Pseudo-Inverses and Nonlinear Least Squares Problems whose Variables Separate," *SIAM J. Numer. Anal.*, vol. 10, No. 2, pp. 413-432 (Apr. 1973).
Ismail et al., "Effects of Inductance on the Propagation Delay and Repeater Insertion in VLSI Circuits," *IEEE Trans. VLSI Systems*, vol. 8, pp. 195-206 (Apr. 2000).
Kamon, "Efficient Techniques for Inductance Extraction of Complex 3-D Geometries," *Master Thesis-Massachusetts Institute of Technology*, 80 pp. (Feb. 1994).
Kamon et al., "Fasthenry: A Multipole-Accelerated 3-D Inductance Extraction Program," *IEEE Trans. Microwave Theory and Techniques*, vol. 42, No. 9, pp. 1750-1758 (Sep. 1994).
Krauter et al., "Layout Based Frequency Dependent Inductance and Resistance Extraction for On-Chip Interconnect Timing Analysis," *IEEE Design Automation Conf. 1998*, pp. 303-308 (1998).
Lu et al., "A Fast Analytical Technique for Estimating the Bounds of On-Chip Clock Wire Inductance," *IEEE Custom Integrated Circuits Conf.*, pp. 241-244 (Jul. 2001).
Massoud et al., "Layout Techniques for Minimizing On-Chip Interconnect Self Inductance," *IEEE Design Automation Conf.*, pp. 566-571 (1998).
Restle, et al. "A Clock Distribution Network for Microprocessors," *IEEE Journal of Solid-State Circuits*, vol. 36, pp. 792-799 (May 2001).
Sakurai, "Closed-Form Expressions for Interconnection Delay, Coupling, and Crosstalk in VLSI's," *IEEE Trans. Electron Devices*, vol. 40, No. 1, pp. 118-124 (Jan. 1993).
"ASITIC: Analysis and Simulation of Spiral Inductors and Transformers for ICs," downloaded from http://rfic.eecs.berkeley.edu/~niknejad/asitic.html, 1 p. (document not dated, downloaded on Aug. 15, 2006).
"ASITIC Documentation: Grackle Release," downloaded from http://rfic.eecs.berkeley.edu/~niknejad/doc-05-26-02/asitic.html, 1 p. (document not dated, downloaded on Aug. 15, 2006).
"ASITIC Commands," downloaded from http://rfic.eecs.berkeley.edu/~niknejad/doc-05-26-02/commands.html, 1 p. (document not dated, downloaded on Aug. 15, 2006).
"ASITIC Documentation: Environmental Variables," downloaded from http://rfic.eecs.berkeley.edu/~niknejad/doc-05-26-02/env.html, 8 pp. (document not dated, downloaded on Aug. 15, 2006).
"ASITIC: Installing and Running," downloaded from http://rfic.eecs.berkeley.edu/~niknejad/doc-05-26-02/install.html, 2 pp. (document not dated, downloaded on Aug. 15, 2006).
"Technology File" downloaded from http://rfic.eecs.berkeley.edu/~niknejad/doc-05-26-02/techfile.html, 5 pp. (document not dated, downloaded on Aug. 15, 2006).
"ASITIC Quickstart," downloaded from http://rfic.eecs.berkeley.edu/~niknejad/doc-05-26-02/quickstart.html, 3 pp. (document not dated, downloaded on Aug. 15, 2006).
"Sample ASITIC Sessions," downloaded from http://rfic.eecs.berkeley.edu/~niknejad/doc-05-26-02/sample.html, 19 pp. (document not dated, downloaded on Aug. 15, 2006).
"ASITIC FAQ," downloaded from http://rfic.eecs.berkeley.edu/~niknejad/doc-05-26-02/faq.html, 7 pp. (document not dated, downloaded on Aug. 15, 2006).
Beattie et al., "Efficient Inductance Extraction via Windowing," *Proc. Design, Automation, and Test in Europe*, pp. 430-436 (2001).
Beattie et al., "Equipotential Shells for Efficient Inductance Extraction," *IEEE Trans. CAD of IC and Systems*, vol. 20, pp. 70-79 (2001).
Beattie et al., "Hierarchical Interconnect Circuit Models," 7 pp. (also published as Beattie et al., "Hierarchical Interconnect Circuit Models," *Proc. ICCAD*, pp. 215-221 (Nov. 2000)).
Beattie et al., "Inductance 101: Modeling and Extraction," *Design Automation Conf.*, pp. 323-328 (2001).
Devgan et al., "How to Efficiently Capture On-Chip Inductance Effects: Introducing a New Circuit Element K," *IEEE*, pp. 150-155 (2000).
Escovar et al., "Transmission line design of Clock Trees," *IEEE*, pp. 334-340 (2002).
Grover, *Inductance Calculations: Working Formulas and Tables*, pp. iii-xiv, 1, 31-61 (1946).
Jackson et al., *Classical Electrodynamics*, pp. xi-xvii, 144-149 (1962).
Lee et al., "Interconnect Inductance Effects on Delay and Crosstalks for Long On-Chip Nets with Fast Input Slew Rates," *IEEE*, pp. II-248 through II-251 (1998).
Niknejad et al., *Design, Simulation and Applications of Inductors and Transformers for Si RF ICs*, pp. 64-69 (2000).
Rosa, "The Self and Mutual Inductances of Linear Conductors," *Bulletin of the Bureau of Standards*, vol. 4, No. 2, pp. 301-344 (1908).
Ruehli, "Inductance Calculations in a Complex Integrated Circuit Environment," *IBM J. Res. Develop.*, pp. 470-481 (1972).

* cited by examiner

Partial self inductance: Comparison between FastHenry and the analytical expression $Z_0$ AS A FUNCTION OF G

RESPONSE FOR $T_{RISE}=0$
AND FOR $T_{RISE} = 30PS$

SYNTHESIS STRATEGIES BASED ON THE APPROPRIATE USE OF INDUCTANCE EFFECTS

CROSS REFERENCE TO RELATED APPLICATIONS

This application is a continuation of U.S. patent application Ser. No. 10/293,900, filed Nov. 12, 2002 now U.S. Pat. No. 7,013,442, which claims the benefit of U.S. Provisional Patent Application 60/335,157, filed Nov. 13, 2001, and U.S. Provisional Patent Application 60/374,208, filed Apr. 19, 2002, all of which are incorporated herein by reference.

BACKGROUND

Inductance effects on interconnects is an emerging concern in high-performance integrated circuits. Because inductance is related directly to the frequency at which an integrated circuit operates, its effects have traditionally been negligible for circuits operating at relatively low clock speeds. With recent advances in integrated circuit technology, however, higher clock speeds are now attainable at which inductance effects can no longer be ignored.

In general, signal propagation in an integrated circuit can be characterized as operating within two distinct subdomains: the domain where inductance effects are negligible (the rc domain), and the domain where inductance effects are appreciable (the rlc domain). Most wire layouts in an integrated circuit operate in the rc domain where effects from inductance are negligible and where characteristic diffusion times are much longer than the propagation time of electromagnetic waves. Signal propagation on a wire is typically measured in terms of the time needed for the output voltage of a wire to reach one-half of its input value, a value generally accepted as sufficient to produce a transition at a transistor located at the output. This time is referred to as the 50% time delay ($t_{50}$%). A well-known approximation of the 50% time delay for an open-ended line operating in the rc domain, termed the Sakurai 50% time delay equation, is:

$$t_{50}\% = 0.377 rcL^2 + 0.693 R_{tr} cL \quad (1)$$

where L is the length of the line, r and c are the resistance and capacitance per unit length of the line, respectively, and $R_{tr}$ is the resistance of the source driving the line. As can be seen from equation (1), the delay exhibits a quadratic increase for longer line lengths L. When delays on rc lines become large, repeaters are often inserted to restore the signal voltage to its maximum driving voltage. Because signal propagation in the rc domain is well-defined and understood, circuit designers and engineers usually attempt to minimize any inductance effects so as not to perturb their traditional design styles. Thus, the natural tendency will be to attempt to minimize inductance so as not to get out of the rlc domain. This approach, however, does not allow signal propagation to occur at its highest possible speed and requires the frequent use of repeaters.

SUMMARY

A synthesis and layout method, such that the time delay is controlled by the wave propagation delay, is provided. In general, the method accounts for and uses inductance effects caused by the propagation of a high-speed signal on a signal wire sandwiched between opposing parallel ground wires. In particular, one of the physical parameters that defines the wiring layout is adjusted to alter the loop inductance, loop resistance, and total capacitance of the wiring layout to create an rlc relationship that maximizes the signal propagation speed on the signal wire and enables transmission-line behavior. In one particular implementation of the method, the physical parameter that is adjusted is the wire separation between the signal wire and the ground wires. In another implementation of the method, the width of the ground wires is the physical parameter that is adjusted.

The disclosed method may also be applied to a wiring layout having multiple branches, such as a clock tree. In this context, the first branch is configured to have a rlc relationship that maximizes the signal propagation speed. A branch directly downstream of, and coupled with, the first branch at a junction may be adjusted so that the impedance at the junction matches that of the first branch. The method may include determining whether adjustment of the downstream branch requires a physical parameter of the wiring layout to exceed a maximum possible value. If the maximum possible value of a physical parameter is exceeded, a repeater may be inserted at the beginning of the downstream branch.

The foregoing and additional features and advantages of the invention will be more readily apparent from the following detailed description, which proceeds with reference to the accompanying drawings.

DETAILED DESCRIPTION

Figure 1:
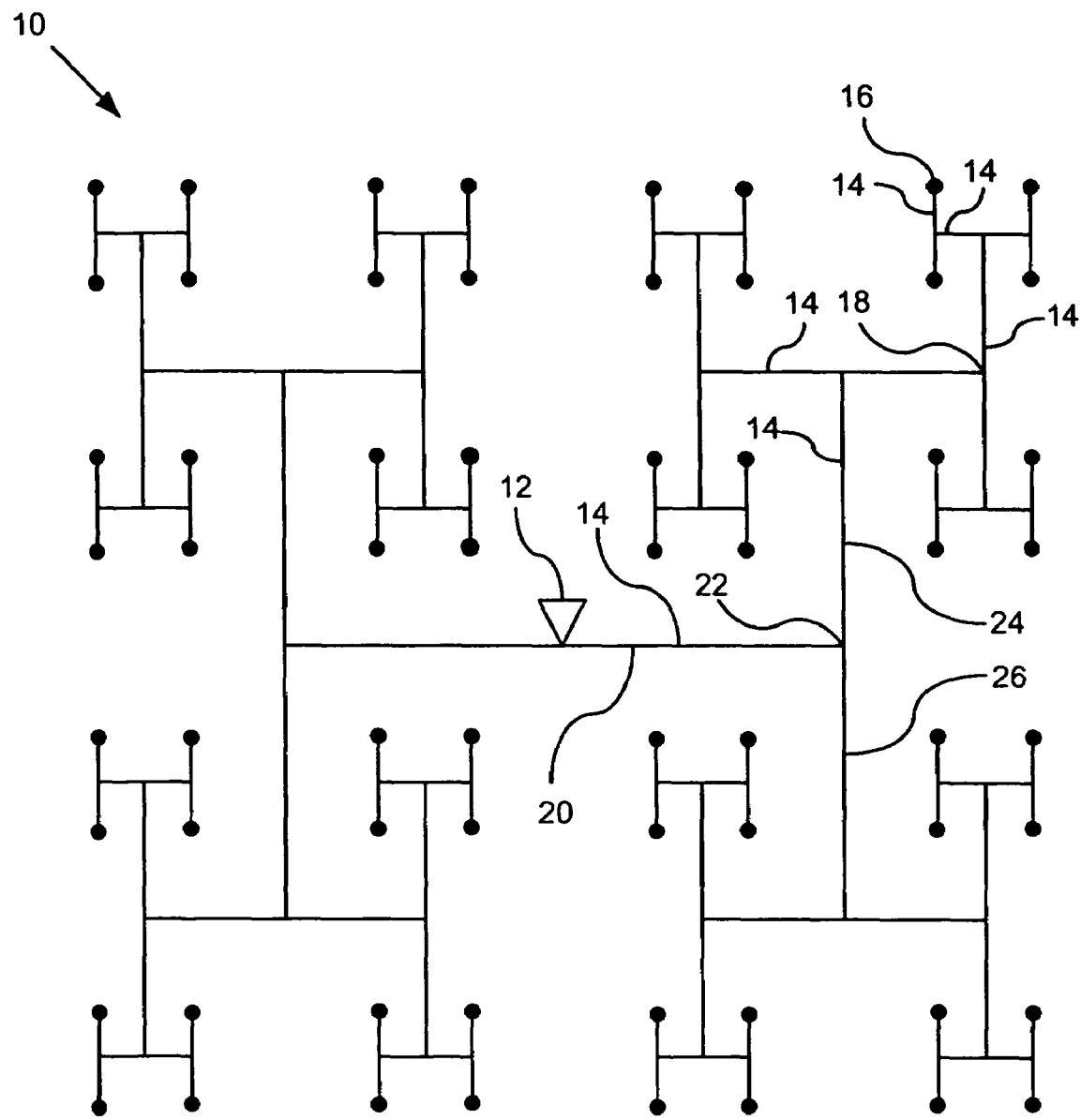
FIG. 1 is an overview of an exemplary clock tree having a balanced H-tree design.

As a result of recent advances in digital technology, integrated circuits are being developed that operate at ever increasing clock speeds. With the latest generation of microprocessors operating at clock frequencies above 2 GHz, inductance effects caused by high-speed signals propagating on the interconnects of an integrated circuit can no longer be ignored. Instead of analyzing the wiring layouts as conventional rc circuits, the new state-of-the art designs should be analyzed as rlc circuits. Although circuit designers and engineers thrive to minimize the inductance effects of a wiring layout in order to use traditional methods, the inductance effects can be utilized so that the time delay can be made as small as physically possible. As more fully described below, the electric and magnetic properties of a wiring layout having a signal wire in the presence of a ground plane or ground wires may be optimized so as to maximize the signal propagation speed and minimize delays, optimization being used to achieve synthesis.

I. General Considerations

The differential equation that describes a distributed rlc signal wire in the presence of a ground plane is:

$$\frac{\partial^2 V(x,t)}{\partial x^2} = lc \frac{\partial^2 V(x,t)}{\partial t^2} + rc \frac{\partial V(x,t)}{\partial t}, \qquad (2)$$

where r, l and c are the resistance, inductance and capacitance per unit of length, respectively. Further, V(x, t) is the potential averaged over the transverse coordinates, where x is the longitudinal coordinate and t is the time. A description based on equation (2) presupposes transverse electromagnetic (TEM) propagation (both the electric and the magnetic field transverse to the direction of propagation) and homogeneity of the medium in the region of interest. In the present disclosure, a description based on TEM (or more appropriately quasi-TEM) propagation is satisfied provided that the transverse dimensions are small compared to the wavelength of the signal λ. For purposes of this disclosure, it is assumed that transverse dimensions are less than 0.1 λ (about 1.5 mm at 0.13 μm technology). This value, however, is not limiting and other values may be possible.

For a signal wire operating in the rlc domain and in the presence of a ground plane, equation (1) is not always valid. A new set of equations has been derived by Davis and Meindl that accurately models such wires. See J. Davis and J. Meindl, *Compact Distributed RLC Interconnect Models*, IEEE Transactions on Electronic Devices, Vol. 47, No. 11, pp. 2068-2087, November 2000. Specifically, the equations show that for a signal wire operating in the rlc domain and in the presence of a ground plane, there exists a region ("Region I") of resistance, inductance, and capacitance parameters (the "rlc parameters") where the signal on the wire propagates at a speed nearly equal to the speed of light in the medium of the signal wire and where the wire exhibits "transmission-line" behavior. Transmission-line behavior is characterized by the propagation delay being linear with the length of the wire. The domain where this behavior occurs is where the rlc parameters satisfy the following inequality:

$$\frac{rL}{Z_0} \leq 2\ln\left(\frac{4Z_0}{R_{tr} + Z_0}\right), \qquad (3)$$

where $Z_0 = \sqrt{l/c}$, l is the loop inductance per unit length of the wire, c is the total capacitance per unit length of the wire, r is the loop resistance per unit length of the wire, L is the length of the wire, and $R_{tr}$ is the resistance of the signal source.

A constraint may be imposed to ensure that no damage occurs as a result of voltage overshoot in the wire. This constraint is met if the following inequality is satisfied:

$$Z_0 \leq R_{tr} \qquad (4)$$

Thus, one can guarantee the minimization of propagation delay by using a wiring layout that satisfies the above inequalities such that the speed of propagation is nearly equal to the speed of light in the medium and transmission-line behavior is exhibited. A final physical constraint may also need to be considered because the physical parameters of the particular wiring layout (i.e., the lengths, widths, spacings, thicknesses, etc., of the wiring layout) must be capable of manufacture using current microlithography technology and must satisfy the TEM conditions described above.

II. The Clock Routing Problem

Fast-switching signals, such as the clock signal, are routed to multiple destinations within an integrated circuit. Because some signal paths are invariably longer than others, synchronizing the arrival time of the signals at their destinations becomes a major problem. Accordingly, clock trees having equal-length signal paths were devised to solve the synchronization problem. Clock trees are also one of the most important wire configurations that can operate in the rlc domain and benefit from signal delay minimization. Therefore, the synthesis method for controlling the delay in a wiring layout as shown and described herein uses a balanced clock tree as an exemplary wiring layout. It should be understood, however, that the disclosed method is not limited to the design of clock trees. The method, for example, may be applied to any wiring layout that operates at a sufficiently high frequency where inductance effects are appreciable.

Clock layouts are designed with two primary factors in mind: (1) the time required for a signal to propagate from a signal source to multiple destinations (the delay); and (2) the variance in the signal arrival times at the various destinations (the skew). Ideally, both factors are minimized so that a signal propagates to all elements in a region in a minimum of time with a minimum of skew. As noted above, a particular configuration of the clock tree may automatically minimize the skew, making delay minimization the only remaining factor to be resolved.

FIG. 1 shows a clock tree design for which skew is automatically minimized. Specifically, FIG. 1 shows a balanced H-tree 10 wherein each path from clock source to destination is of an equal length. A clock source 12 is located centrally within the tree 10. A series of six branches 14, extend from the source 12 and ultimately couple the source with multiple destinations, or "leaf nodes" (e.g., leaf node 16). The leaf nodes may be coupled with smaller grids of digital elements that are clocked by the clock signal. Typically, elements within the grids are so closely positioned to one another that any clock skew experienced within the grid is negligible. A branch of the clock layout may begin at either a signal source (e.g., a clock source 12, a repeater, a transistor, etc.) or a junction (e.g., junction 18). The junction may be a T-junction, as shown at the junction 18, or other multi-branched junction. A branch may terminate at either a leaf node, another junction, or other circuit element (e.g., repeater, transistor, etc.). Thus, for example, an exemplary branch 20 begins at the clock source 12 and ends at junction 22. Additionally, a clock tree has a certain "depth" associated with it corresponding to the number of branches a clock signal must propagate along to reach a leaf node from the clock source. In FIG. 1, for example, clock tree 10 has a depth of six because there are six branches a clock signal must propagate along before it reaches a leaf node from the clock source.

Figure 2:
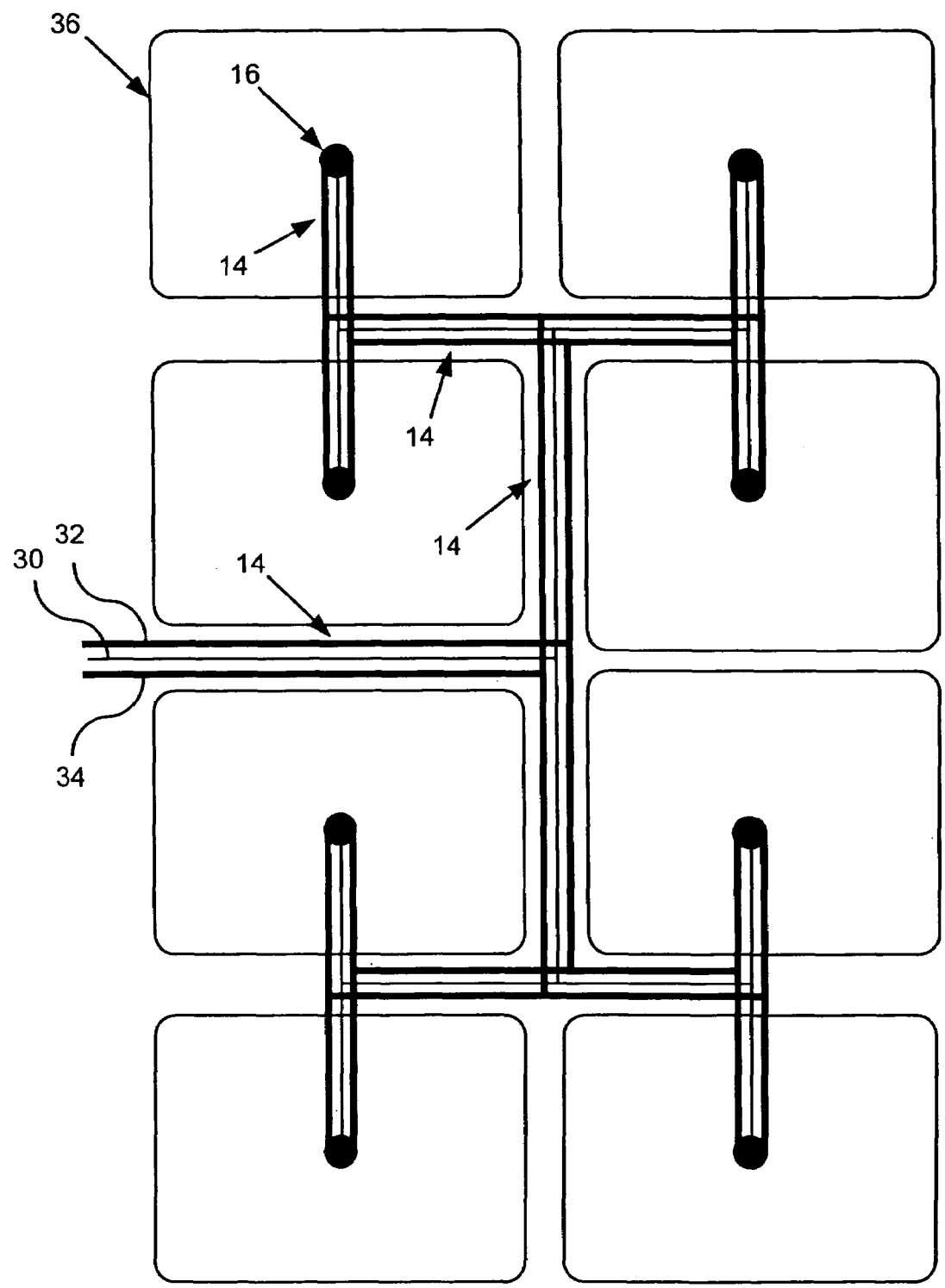
FIG. 2 shows a portion of the clock tree of FIG. 1 in greater detail, including a sandwich-style wiring layout.

FIG. 2 shows a particular type of balanced H-tree known as a sandwich balanced H-tree ("SBHT"). Specifically, FIG. 2 shows four branches (or "sandwiches") 14 of an SBHT clock tree terminating at eight leaf nodes 16. An SBHT is characterized by the presence of two parallel ground wires 32, 34 surrounding a signal wire 30, thereby forming a "sandwich-style" wiring layout. Ground wires 32, 34 are positioned on respective opposite sides of the signal wire 30 and are typically located at equal distances from signal wire 30. Ground wires 32, 34 serve as return paths for the current on signal wire 30. FIG. 2 also shows that the multiple leaf nodes 16 are each coupled with grids, shown generally at 36, which contain various other digital elements of the integrated circuit where the signal must arrive.

Figure 3:
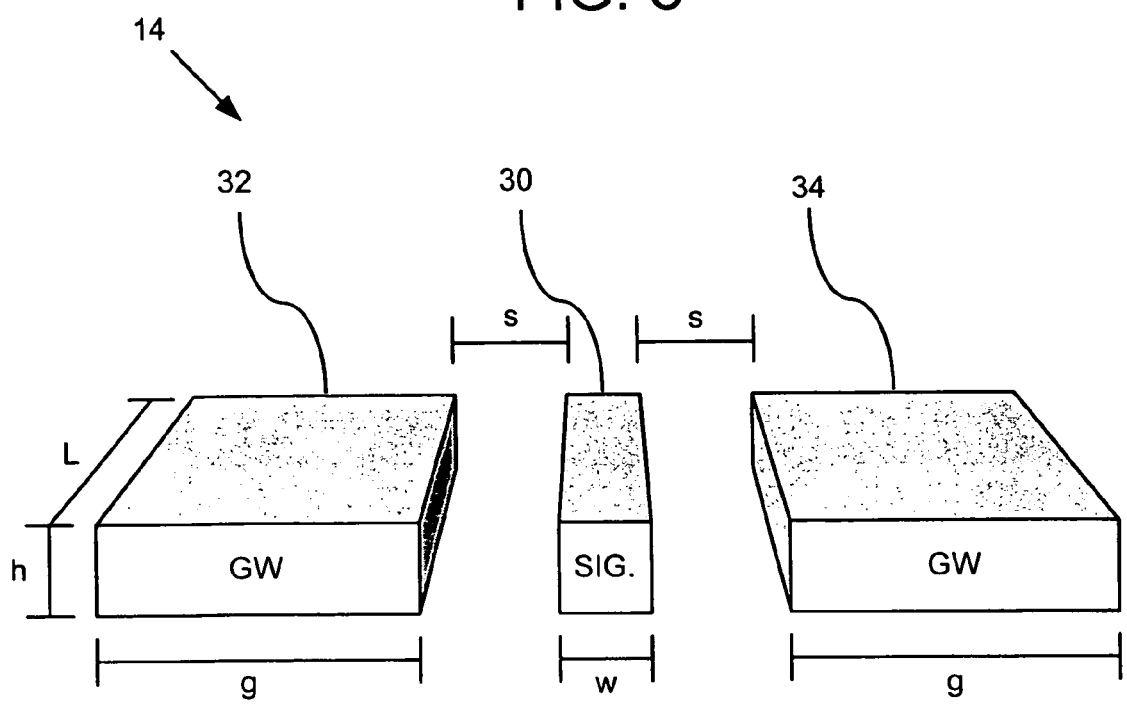
FIG. 3 is a cross-sectional view schematically showing the physical parameters of an exemplary sandwich-style wiring layout of FIG. 2.

FIG. 3 is a cross-sectional view of a sandwich-style branch in an SBHT. Branch 14 has a signal wire 30 with a width w. Two opposing ground wires 32, 34 are located on respective opposite sides of signal wire 30, thereby "sandwiching" the signal wire. Each of the ground wires 32, 34 has a width g and an edge-to-edge wire separation s from signal wire 30. The size of wire separation s may be limited by physical design or manufacturing limitations. Accordingly, a minimum and a maximum value of s exist, denoted ($s_{min}$, $s_{max}$), respectively. Both signal wire 30 and ground wires 32, 34 have a length L and a thickness h. Thickness h corresponds to the thickness of the metal layer of the integrated circuit in which the signal wire 30 and ground wires 32, 34 are located.

One attribute of a sandwich-style wiring layout is that the total value of each electrical parameter (loop resistance, loop inductance, and total capacitance) of any path from source to destination can be approximated as the sum of the electrical parameters of the path segments that form it. Thus, one can evaluate the electrical parameters of each branch of an SBHT independent of the other branches. More specifically, for a path $P(I, D_i) = \{I=N_0, N_1, \ldots, N_n=D_i\}$ from clock input I to one of multiple destinations $D_i$, where $i=1, \ldots, 2^{n-1}$, $$L \cdot r_{loop}(P(I, D_i)) = \sum_{j=1}^{n} L_j r_{loop}(\{N_{j-1}, N_j\}) \quad (5)$$

$$L \cdot l_{loop}(P(I, D_i)) = \sum_{j=1}^{n} L_j l_{loop}(\{N_{j-1}, N_j\}) + \varepsilon$$

$$L \cdot c_{tot}(P(I, D_i)) = \sum_{j=1}^{n} L_j c_{tot}(\{N_{j-1}, N_j\}) + \varepsilon'$$

The value $\varepsilon$ corresponds to the summation of mutual inductances of orthogonal and/or far-separated circuits, rendering the correction negligible. Likewise, the most relevant contribution to $\varepsilon'$ comes from capacitance effects at the T-junctions, whose dimensions are small enough to be neglected.

Another attribute of a sandwich-style wiring layout is that the loop inductance of the signal wire 30 with ground wires 32, 34 as return paths can be controlled by altering the parameters of the design. For instance, the wire separation s between signal wire 30 and ground wires 32, 34 or the ground wire width g can be altered individually or in combination to change the loop inductance. The total capacitance of the layout is dependent on wire separation s. The loop resistance of the layout, however, is dependent on the ground wire width g, but not the wire separation s.

The adjustment of the rlc parameters of a sandwich-style wiring layout by altering the wire separation s and wire width g has consequences for the time delay of the signal. For instance, for a given sandwich-style wiring layout where all parameters are fixed except for wire separation s, a set of wire separations s can be found that allow the wiring layout to operate in Region I (discussed above in the General Considerations section). Similarly, for a given layout where all parameters but ground wire width g are fixed, a set of ground wire widths g can be found that allow the layout to operate in Region I.

III. The General Method of Configuring a Wiring Layout

Figure 4:
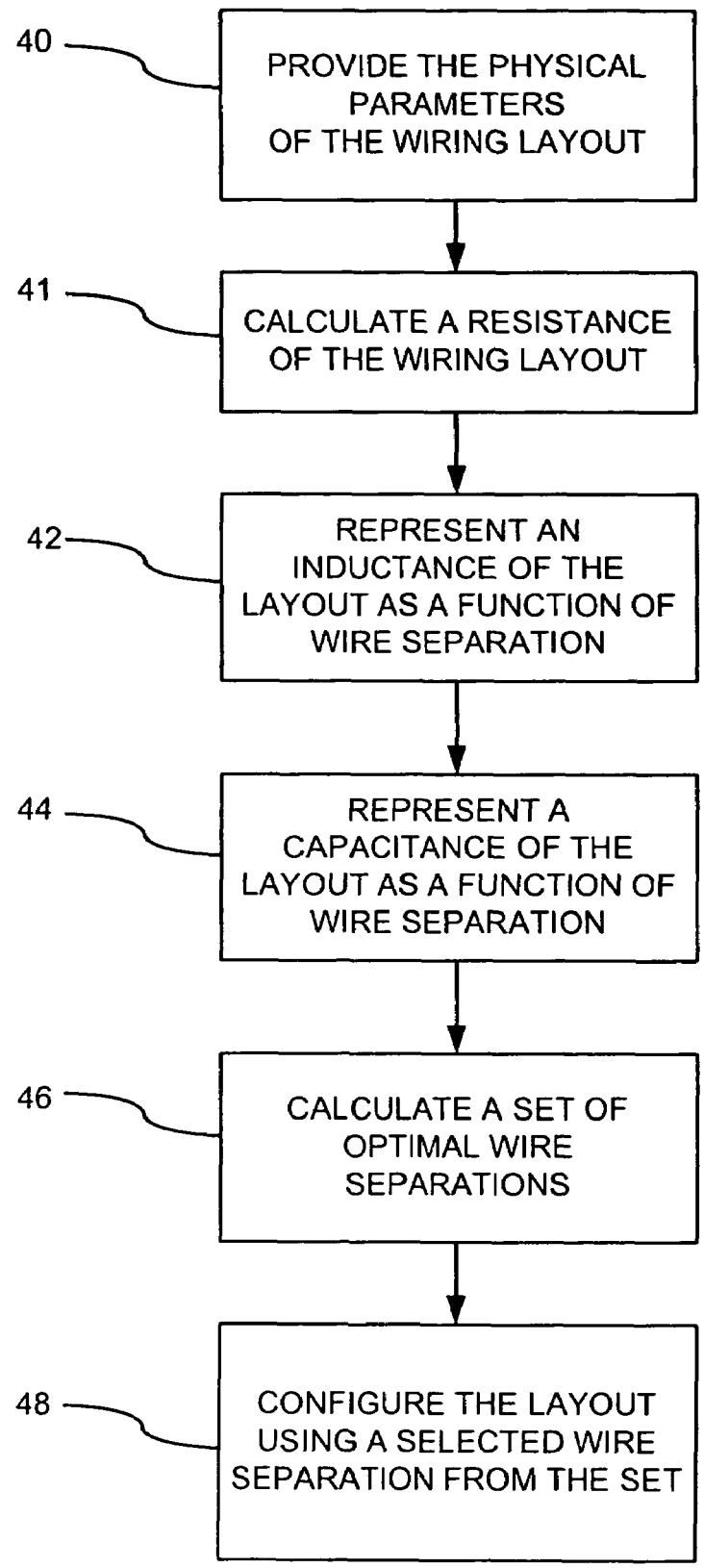
FIG. 4 is a flowchart of a general method of configuring a wiring layout.

FIG. 4 is a flowchart showing a method for configuring a sandwich-style wiring layout by varying the wire separation s such that the wiring layout exhibits signal propagation at nearly the speed of light in the medium of the signal wire and exhibits transmission-line behavior. It is understood that the method could be modified for calculating the corresponding set of any other of the physical parameters of the wiring layout that affect rlc values. The sandwich-style wiring layout comprises a signal wire with two opposing parallel ground wires, as described above. The wiring layout may constitute an entire wiring layout from a signal source to a destination. Alternatively, the wiring layout may comprise a single branch of a SBHT, which, as noted above, can be analyzed separately from the other branches. In process block 40, the physical parameters of a sandwich-style wiring layout are provided. The physical parameters may include the signal wire width w, metal layer thickness h, ground wire width g, and wire length L. In process block 41, the loop resistance of the wiring layout is calculated. In process block 42, the loop inductance of the wiring layout is represented as a function of wire separation. The loop inductance of the layout is determined using the other physical characteristics of the layout as fixed parameters and the wire separation as the only variable. The loop inductance of the layout is a linear combination of the partial self inductance of each wire and the partial mutual inductance between each pair of wires. The inductance effects can be calculated using the simplified expressions discussed below. In process block 44, the capacitance of the wiring layout is represented as a function of wire separation. Like inductance, the capacitance of the layout is determined using the other physical characteristics of the layout as fixed parameters and the wire separation as the only variable. As more fully described below, to solve for the capacitance of the layout, function approximation techniques that perform data fitting to 3-D simulation results may be used. For instance, a non-linear least square method may be used. In process block 46, a set of wire separations is found such that the corresponding wiring layout operates in Region I while preventing voltage overshoot. The process of calculating this set is more fully explained below with reference to FIG. 6. In process block 48, a single wire separation is selected from this set of wire separations, and the layout is configured using the selected wire separation. The process of selecting a wire separation is more fully explained below with reference to FIG. 16.

A. Calculating the rlc Parameters

1. The rlc Parameters Generally

Figure 5:
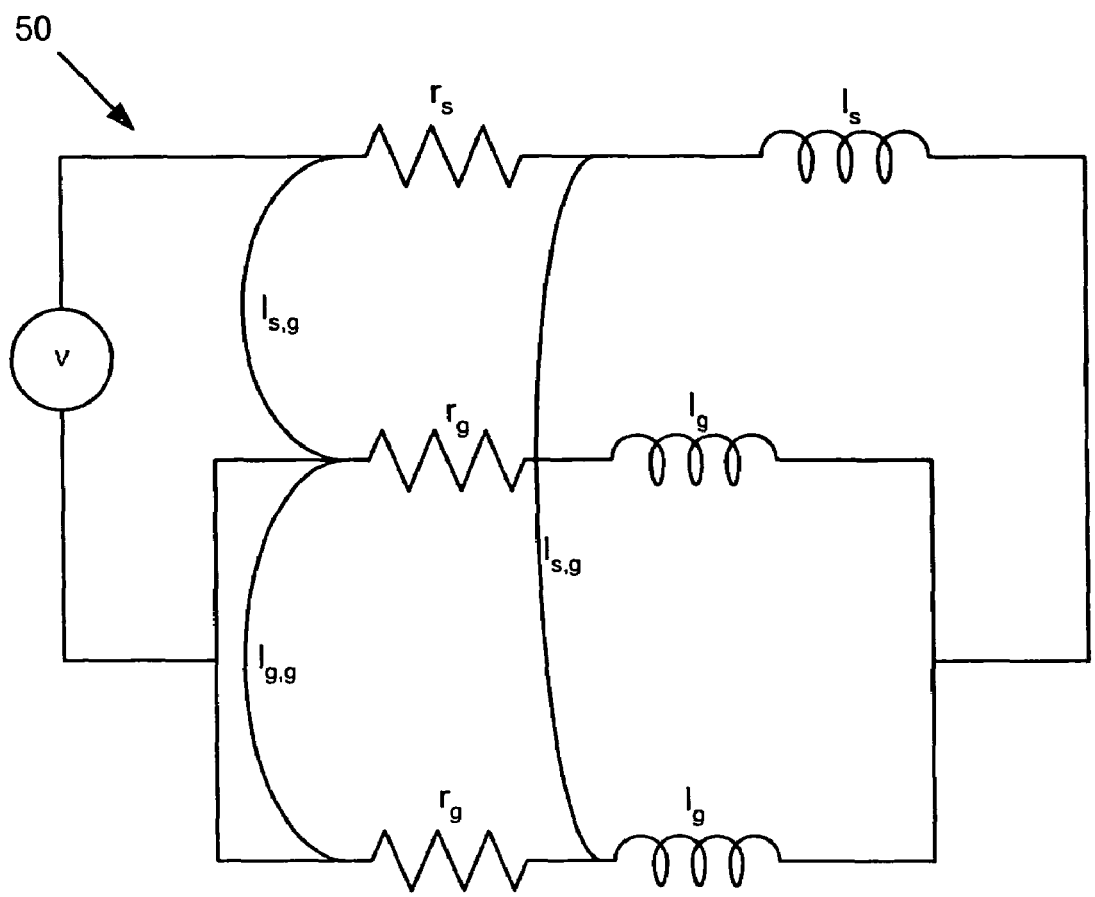
FIG. 5 is a circuit diagram showing the electrical characteristics of a branch of a sandwich-balanced H-tree.
Figure 5:
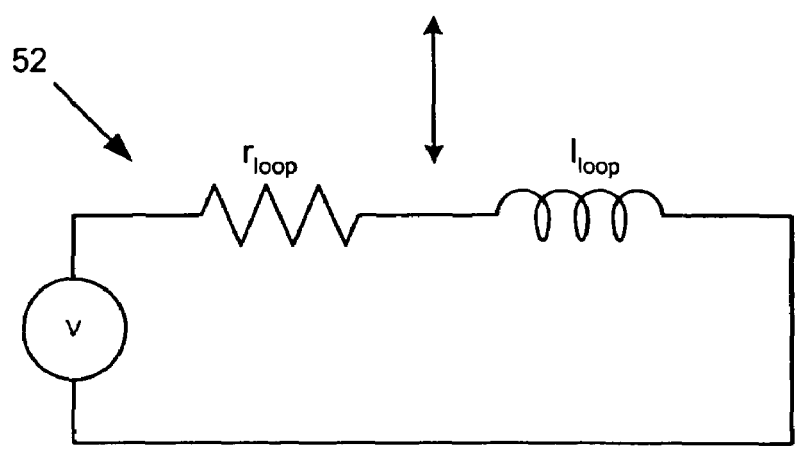

A tree of depth n is composed of $2^n-1$ sandwiches. The equivalent serial circuit of a sandwich configuration (a line with a return ground plane) can be obtained using circuit algebra. FIG. 5 shows two circuits equivalent to the sandwich configuration. Specifically, circuit diagram 50 shows an equivalent circuit with each circuit element displayed. For instance, $l_{s,g}$ is the mutual inductance between the signal wire s and one of the ground wires g. Circuit 52, on the other hand, shows an equivalent circuit with only the resistance and inductance of the loop displayed.

The equivalent loop resistance per unit length is given by:

$$r_{loop} = r_s + \frac{r_g}{2}, \quad (6)$$

where $r_s$ and $r_g$ are the resistance per unit of length of the signal wire and ground wires, respectively. As explained above, the total equivalent resistance is separable and given by the sum of the total equivalent resistances for each partition.

To compute the equivalent loop inductance per unit length for one sandwich of the SBHT tree, reference should be made to FIG. 5. The resulting $l_{loop}$ can be immediately inferred:

$$l_{loop} = l_s - 2l_{s,g} + \frac{1}{2}l_{g,g} + \frac{1}{2}l_g, \quad (7)$$

where $l_s$ and $l_g$ are the partial self inductances of the signal wire and the ground wires, respectively. The values $l_{s,g}$ and $l_{g,g}$ refer to the partial mutual inductances of the signal wire with the ground wires and the ground wires with the ground wires, respectively. The separability into multiple independent configurations (i.e., the application of the cascade rule to the configuration) can be verified using an inductance simulation program such as FastHenry, which is available from the Massachusetts Institute of Technology.

The equivalent capacitance per unit length of a sandwich $c_{tot}$ is given by:

$$c_{tot} = 2c_{s,g} + c_r, \quad (8)$$

with $c_{s,g}$ the mutual capacitance between one ground wire and the signal wire, and $c_r$ the sum of the capacitances of the signal wire to the substrate and to other wires not participating in the return path. As mentioned before, the total equivalent capacitance of the signal path from source to destination is separable and given by the sum of the total equivalent capacitances of each partition. Errors due to mutual coupling between partitions are negligible.

The problem now becomes one of computing accurately the $r_{loop}$, $l_{loop}$, $c_{tot}$, parameters that correspond to the r, l, and c values that enter in the transmission-line equation (3). As noted above, the computation is made as a function of the physical parameters: L, w, h, g and s (see FIG. 3).

2. Resistance

In this section, a method is described for calculating the resistance as may be used in process block 41 of FIG. 4. The resistance per unit length for a straight wire is given by the simple expression:

$$r = \frac{1}{\sigma w h}, \quad (9)$$

with σ the conductivity of the metal, w the width of the wire, and h the thickness of the wire. The results are inserted in equation (6) for both $r_s$ and $r_g$.

3. Inductance

Figure 6:
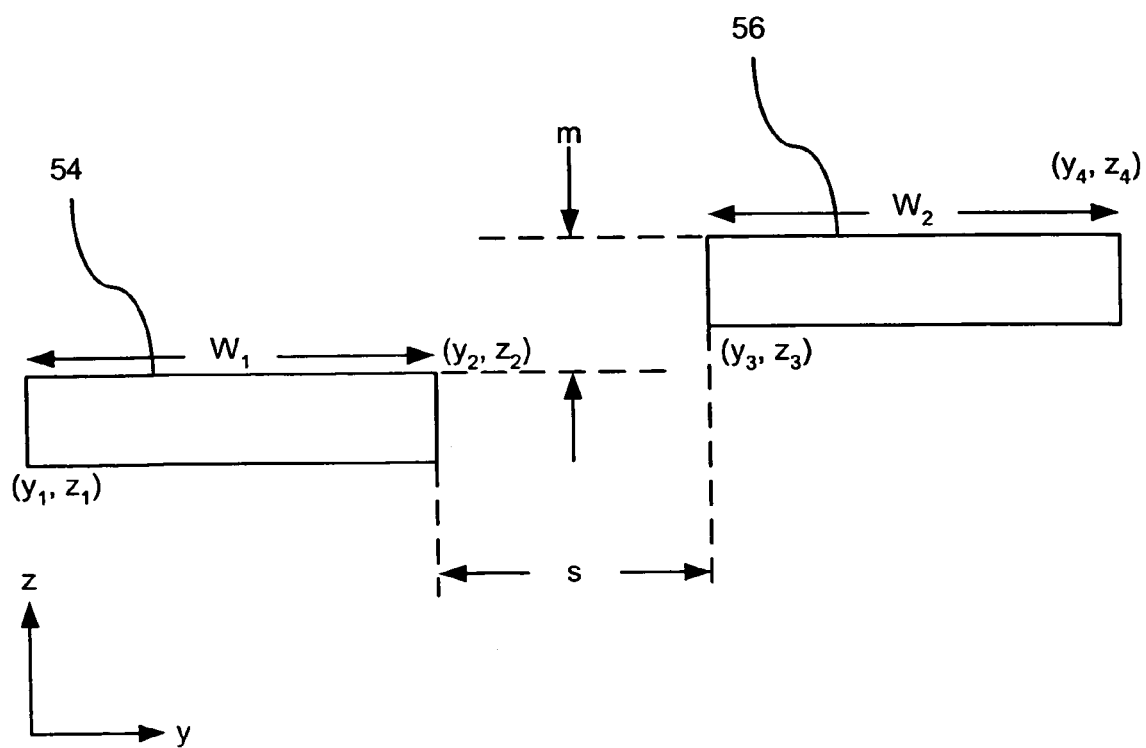
FIG. 6 is a cross-sectional view schematically showing the physical parameters used to calculate the inductance of a branch of a sandwich balanced H-tree.

In this section, a method is described for calculating inductance as may be used in process block 42 of FIG. 4. The calculation of the loop inductance for the configuration of interest, the sandwich configuration, can be obtained from the general expression for the partial mutual inductance ($\mathcal{L}$) of two filaments i,j:

$$\mathcal{L}_{i,j} = \frac{\mu_0}{4\pi} \int \int \frac{1_i \cdot 1_j}{\|\vec{x} - \vec{x}'\|} ds' ds, \quad (10)$$

with $\mu_0$ the permeability of the vacuum, 1 the unit vector in the direction of the current, and the denominator of the integral the distance between two points in the wires. The integrals are extended over the lengths of the filaments. Furthermore, integrating the above expression over the transverse area occupied by the two conductors, and dividing by the product of the total cross sectional areas, leads to the following close-form solution for the partial mutual inductance of two wires of rectangular cross-section of the same length L:

$$\mathcal{L}_{mutual} = \frac{\mu_0 L}{2\pi} \left[ \ln\left(\frac{L}{d} + \sqrt{1 + \frac{L^2}{d^2}}\right) - \sqrt{1 + \frac{d^2}{L^2}} + \frac{d}{L} \right], \quad (11)$$

with d the geometric mean distance (GMD) between the two wires. The GMD of two wires of the same length is given by:

$$\ln(GMD_{A,B}) = \quad (12)$$
$$\frac{1}{A \times B} \int_{y_1}^{y_2} \int_{z_1}^{z_2} \int_{y_3}^{y_4} \int_{z_3}^{z_4} \ln\sqrt{(y-y')^2 + (z-z')^2} \, dz' \, dy' \, dz \, dy,$$

with $A = w_1 \times (z_2 - z_1)$ and $B = w_2 \times (z_4 - z_3)$, the areas of the cross-sections. The geometry is explained in FIG. 6. FIG. 6 shows a first wire 54 and a second wire 56 and the geometrical parameters of equation (12) that define their relation to one another.

To calculate the partial self inductance of a wire of rectangular cross-section, the same equation (11) applies. The GMD of a single wire of area w×h is well approximated by:

$$\ln(d) = \ln(w+h) - 3/2. \quad (13)$$

Figure 7:
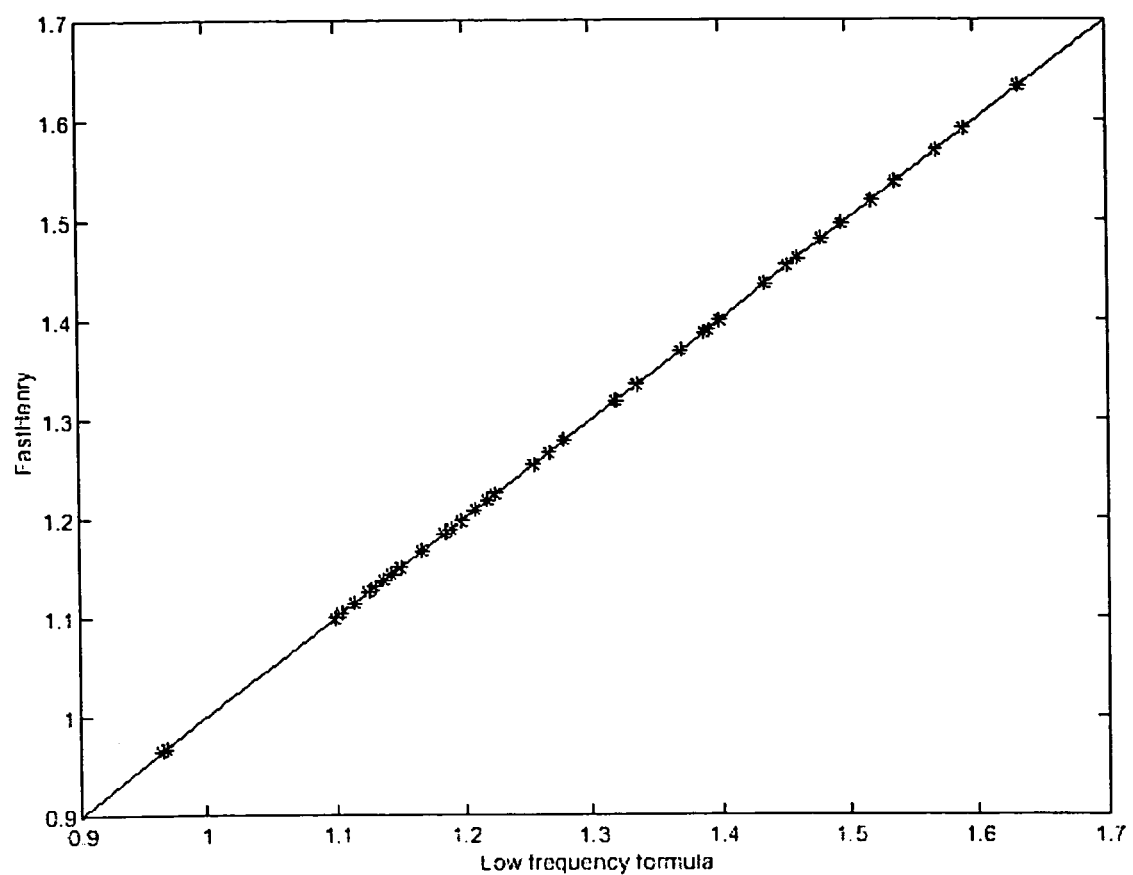
FIG. 7 is a graph comparing the partial self inductance of an exemplary wiring layout as calculated by FastHenry and by the disclosed simplified expression.

See F. Grover, *Inductance Calculations Working Formula and Tables*, Instrument Society of America, 1945. As shown in FIG. 7, the result of using equations (11) and (12) for computing partial self inductance of rectangular wires is accurate to within 1% when compared to 3-D simulations with FastHenry for isolated lines in the frequency domain of interest. The method is also computationally efficient. Some corrections may apply when neighboring wires are sufficiently close (see the "additional consideration" section below)

For partial mutual inductance, the following approximation to the GMD of two wires with identical rectangular cross-section and equal length is used:

$$\ln(GMD) = \ln(a) + \ln(k) \qquad (14)$$

with a the center-to-center distance between the wires and ln(k) a tabulated correction value.

Figure 8A:
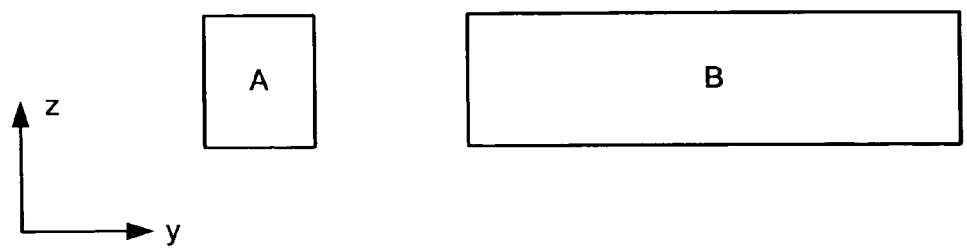
FIGS. 8(A) and 8(B) are cross-sectional views schematically showing how to calculate the inductance between wires having different wire widths.
Figure 8B:
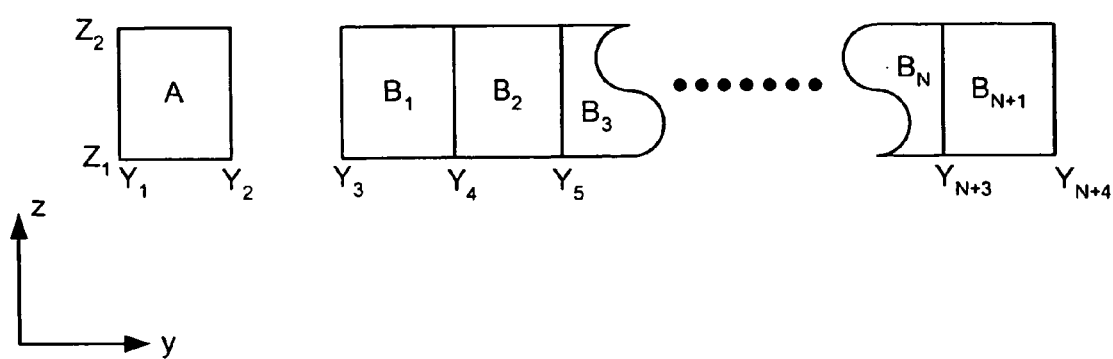

To compute the GMD of two wires of the same length and the same thickness, but with different widths (FIG. 8(A)), the wire with maximum width (wire B) is partitioned into $n = \lfloor B/A \rfloor$ pieces of area $B_i = A$, for $i = 1, \ldots n$ and a remaining piece of area $B_{n+1}$ (FIG. 8(B)). The following proposition permits the original GMD to be approximated using the formula for equal cross-sections: given a situation as in FIG. 8(B), it follows that $$\ln(GMD_{A,B}) = \frac{A \sum_{i=1}^{n} (\ln(GMD_{A,B_i})) + B_{n+1} \ln(GMD_{A,B_{n+1}})}{nA + B_{n+1}} \qquad (15)$$

Figure 9:
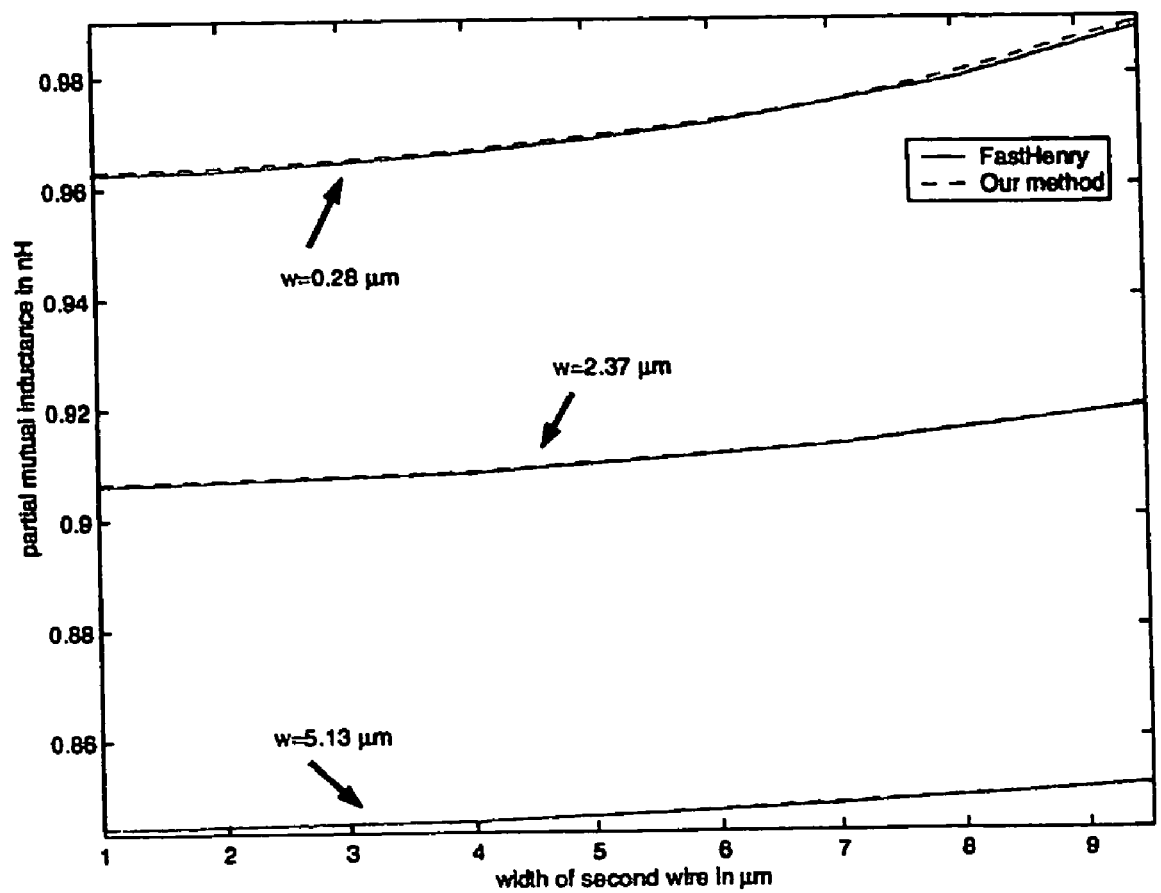
FIG. 9 is a graph comparing the partial mutual inductance of an exemplary wiring layout.

The proof of the proposition follows directly from equation (12). In equation (15), all but the last term correspond to calculations of GMD of wires of equal cross-section. To compute $GMD_{A,B_{n+1}}$ recursion with the same equation (15) may be used, but with A changed to $B_{n+1}$ and B changed to A. Recursion continues until the last remaining term is of negligible or zero size. It has been verified that a recursion depth of four suffices to achieve an upper bound of 1% of error in the computation of the partial mutual inductance for realistic configurations. This small amount of error is shown in FIG. 9, which displays a comparison between results obtained using FastHenry and the simplified expression. The final step is to combine the different terms into equation (7). This completes the accurate computation of loop inductance in terms of the physical parameters. The resulting code is computationally efficient, while maintaining the precision of the 3-D-simulator FastHenry.

4. Capacitance

In this section, a method is described for calculating capacitance as may be used in process block 44 of FIG. 4. The capacitance value c that enters in the optimization problem is the total capacitance of the signal line. This is the sum of the values of mutual capacitances with the ground neighbors $c_{s,g1}$ and $c_{s,g2}$ plus the sum of the cross-coupling capacitances to the wires in lower layer(s) plus the capacitance to the substrate, which is termed $c_r$. Given the symmetry of the problem:

$$c_{s,g} := c_{s,g1} = c_{s,g2}, \qquad (16)$$

there are no closed-form expressions for the capacitance. Thus, an efficient and accurate method to calculate $c_{tot}$ for different geometrical configurations is needed. Function approximation techniques may be used that perform data fitting to 3-D simulation results. The data fitting process is the result of a nonlinear least square fit. The capacitance of the signal wire with respect to its neighbor ($c_{s,g}$), and its capacitance with respect to the layer beneath plus the capacitance with the substrate ($c_r$) are considered separately. For fitting purposes, three-dimensional simulations performed with ICARE may be used. ICARE is available through LETI, France. The following functional form for the mutual capacitance between the signal wire and one of its ground neighbors may be used:

$$c_{s,g}(s, w) \approx \left(\beta_1 e^{-\alpha_1 \frac{s}{s_{\min}}} + \beta_2 \left(\frac{s}{s_{\min}}\right)^{-\alpha_2}\right)\left(\frac{w}{w_{\min}}\right)^{\alpha_3}, \qquad (17)$$

with $s_{min}$ and $w_{min}$ the minimum separation and width allowed by the technology. Fitting equation (17) to a given set of observations is handled as a nonlinear least square problem.

The variables separate in the following fashion:

$$c_{s,g}(s, w) \approx c_1(s) * c_2(w), \qquad (18)$$

thus permitting two independent least square problems. First, a uniform distributed collection of values of variable s, $s = \{s_1, s_2, \ldots, s_n\}$ is selected. Then, the respective observation values $y_i = c_{s,g}(s_i, w = w_{min})$ are obtained using ICARE.

The values $\beta = (\beta_1, \beta_2)$ and $\alpha = (\alpha_1, \alpha_2)$ must be found that minimize the nonlinear functional:

$$r(\beta, \alpha) = \sum_{i=1}^{n} [y_i - c_1(\beta, \alpha; s_i)]^2. \qquad (19)$$

To compute $\alpha_3$, a value of $s = s_k$ is fixed and a data set is generated by performing simulations for $w = \{w_1, w_2, \ldots, w_m\}$. The resulting observations are called $y_i = c_{s,g}(s_k, w_i)$. The problem becomes one of fitting the data $(w_i, y_i)$ to the equation $$c_{s,g}(w) = c_1(s_k)\left(\frac{w}{w_{\min}}\right)^{\alpha_3}. \qquad (20)$$

The nonlinear least square method is reapplied to obtain $\alpha_3$.

Figure 10:
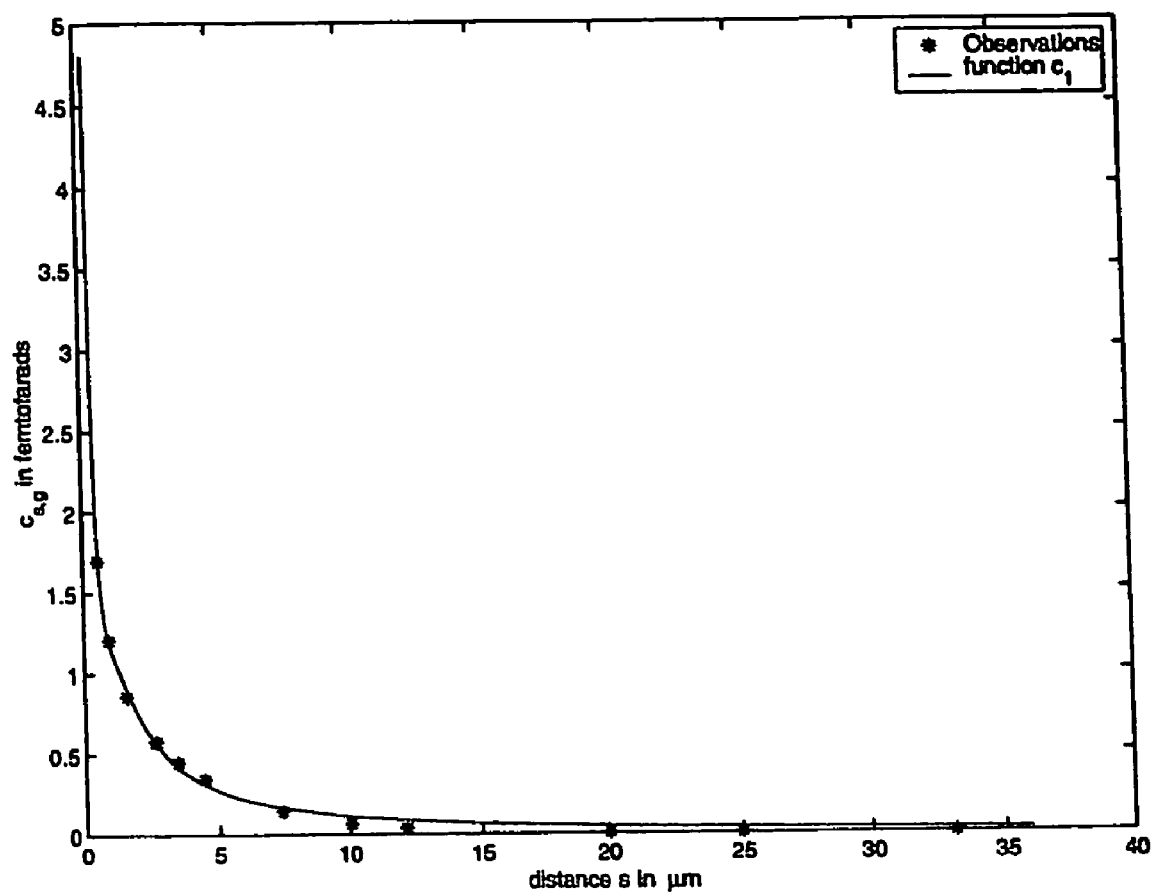
FIG. 10 is a graph comparing the capacitance function $c_1$ with chosen observation values.
Figure 11:
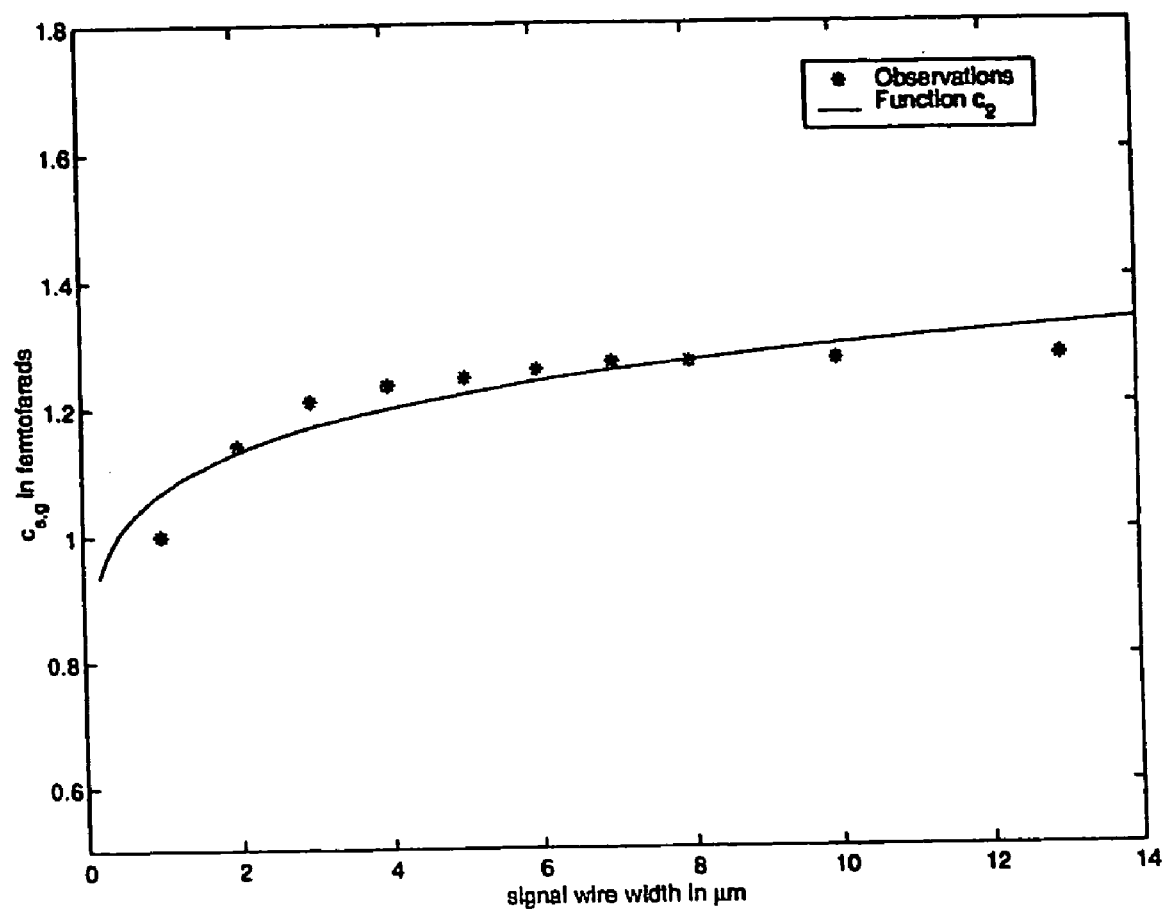
FIG. 11 is a graph comparing the capacitance function $c_2$ with chosen observation values.

The program VARPRO, which is available from Stanford University, may be used to find the values of the linear and nonlinear parameters that are optimal in the least square sense. FIGS. 10 and 11 display the fits. The equivalent capacitance to other layers not participating in the return path of the currents but contributing to the total capacitance of the signal line is mimicked with that of a single line running orthogonal to the signal and having a ground plane below. The magnitude is only weakly dependent on s and g for fixed w. Thus, it is allowable to perform, with little loss in precision, an average in s and g to represent $c_r$.

B. Determining the Solution Interval of Wire Separations

Figure 12:
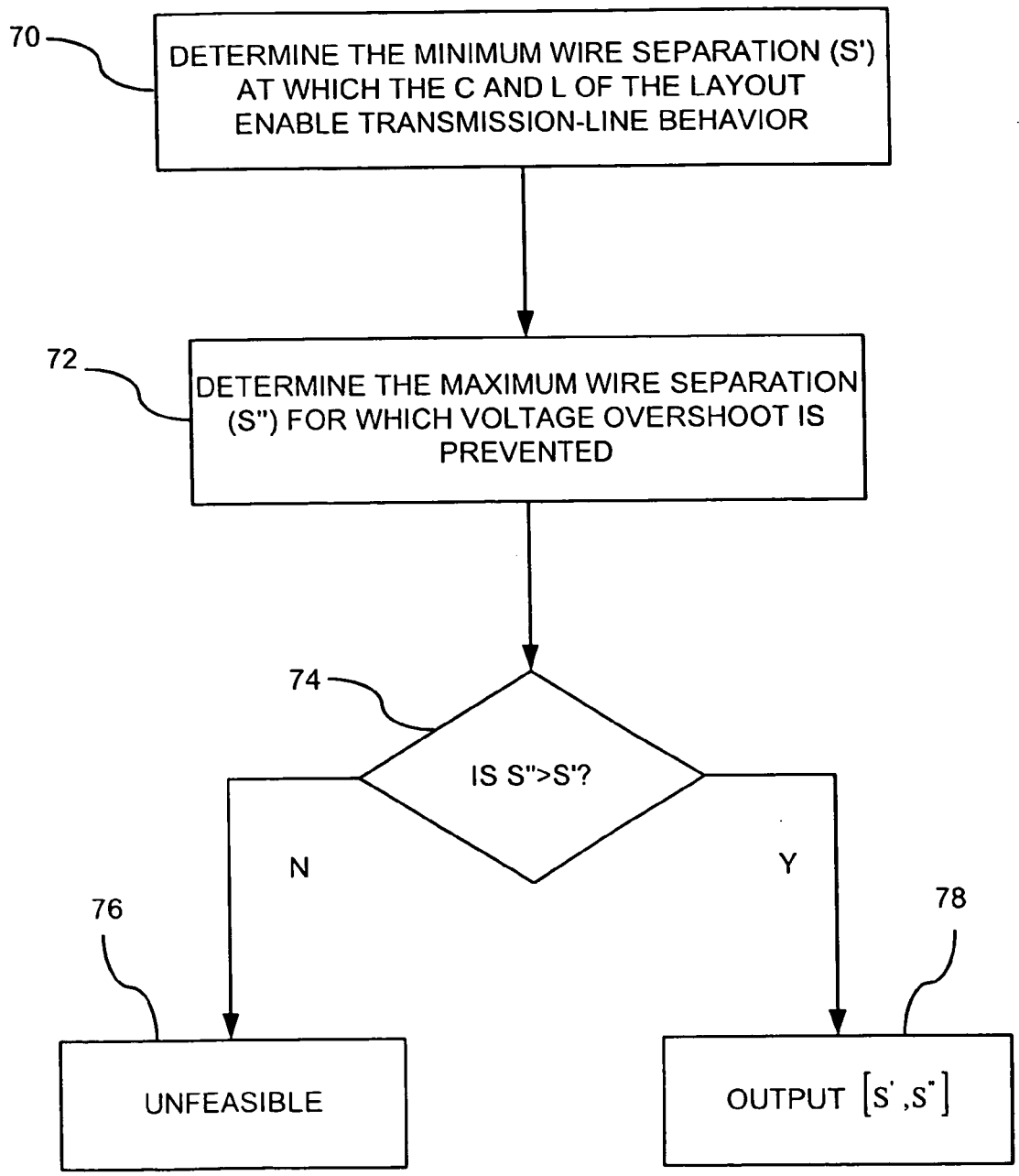
FIG. 12 is a flowchart showing a method of calculating a set of optimal wire separations (s).

FIG. 12 is a flowchart showing a method for determining the solution interval of wire separations in a wiring layout as may be used in process block 46 in FIG. 4. In process block 70, a minimum wire separation s' is determined at which an rlc relationship is created in the wiring layout such that it operates in Region I. Wire separation s' is calculated by redefining equation (3) as a functional F where:

$$F = \frac{rL}{Z_0} - 2\ln\left(\frac{4Z_0}{R_{tr} + Z_0}\right) \quad (21)$$

and searching for the value of s where F=0 using the functions for inductance and capacitance derived in process blocks 42 and 44 of FIG. 4. The value of s for which F=0 corresponds to s'. Functional F is monotonically decreasing with s, which assures that if s>s' then $F(s) \leq 0$. Therefore, the value s' corresponds to the left side of the solution interval.

In process block 72, a maximum wire separation s" is determined at which an rlc relationship is created enabling the wiring layout to operate in Region I. Wire separation s" corresponds to the right side of the solution interval. Wire separation s" is calculated by redefining the overshoot restriction given in equation (4) as a functional P where:

$$P = Z_0 - R_{tr} \quad (22)$$

and searching for the value of s where P=0. Functional P is monotonically increasing with s, this assures that for s<s", with P(s")=0 then $P(s) \leq 0$. The solution interval, if it exists, is then $S \in [s', s'']$ In order to find F=0 and P=0, Newton's method to solve systems of nonlinear equations is used. Since Newton's method is locally convergent, the bisection method is performed to the first iterates in order to assure convergence from any point. This is well known as a global convergent version of Newton's method. The system of non linear equations to be solved is:

$$\begin{pmatrix} F(s') \\ P(s'') \end{pmatrix} = \begin{pmatrix} 0 \\ 0 \end{pmatrix}. \quad (23)$$

At process block 74, a determination is made as to whether s" is greater than s'. This determination is done to ensure that a feasible set of wire separations exists. If s" is greater than s', then a feasible set of optimal wire separations exists, which is output at process block 78. If s" is less than s', then no feasible set of optimal wire separations exist and this fact is output at process block 76. If no feasible set of optimal wire separations exist, then the other physical parameters of the wiring layout may have to be changed to allow for the wiring layout to operate in Region I.

The process described above may be summarized as follows. To find the solution interval for variable s, for a fixed value of g, two values of s: $s = s_F$, $s_P$ where $F(s_F)=0$, $P(s_P)=0$ are searched. The solution interval for s where the restrictions $F(s) \leq 0$ and $P(s) \leq 0$ are simultaneously satisfied, if it exists, is the intersection of the following two intervals: $[s_F, \lambda/10)$ and $[s_{min}, s_P]$. The upper bound $\lambda/10$ is the limit of validity of the transmission-line representation.

Figure 13:
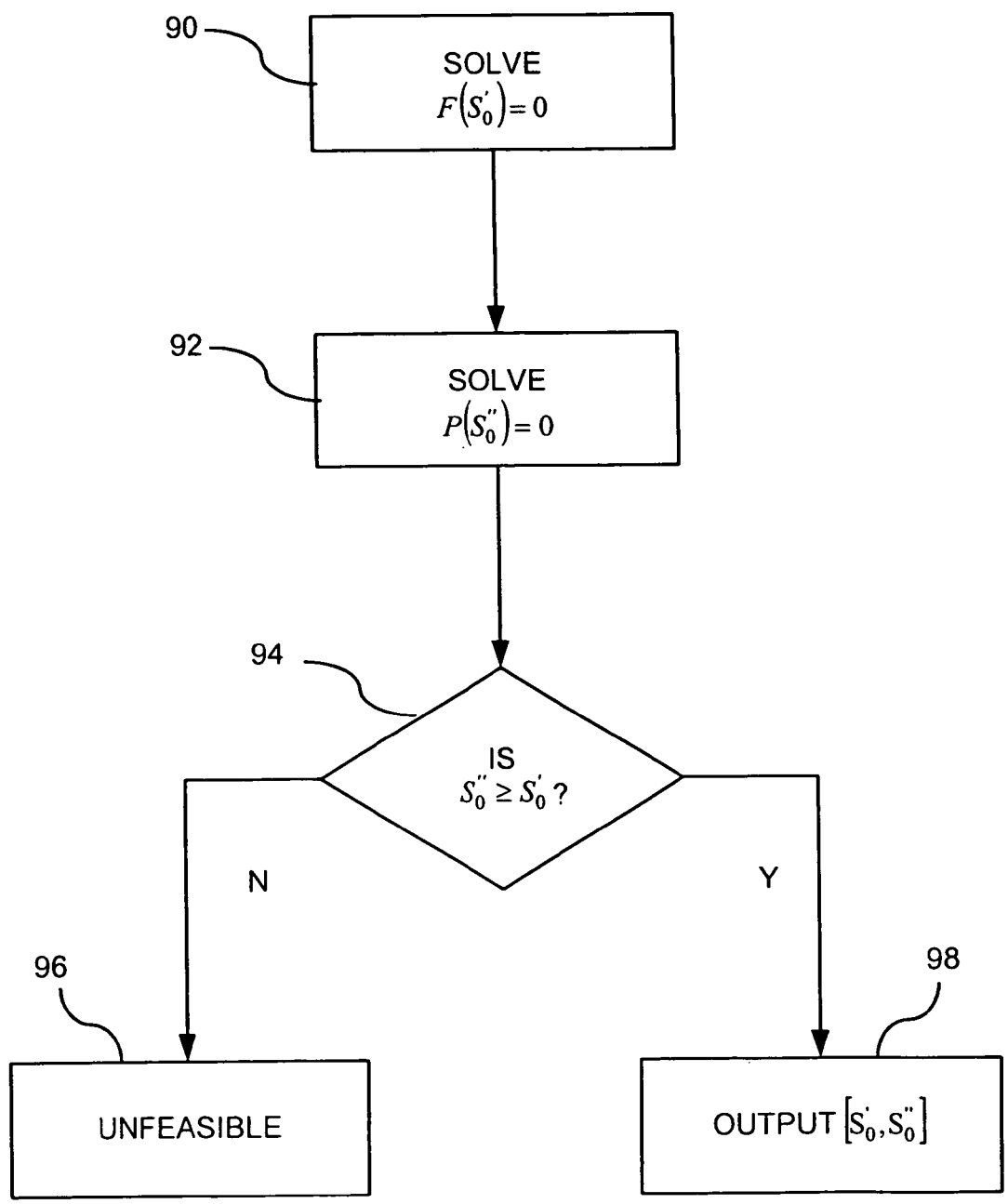
FIG. 13 is a flowchart showing the method of FIG. 12 in terms of mathematical functions.

FIG. 13 is a flow chart identical to FIG. 12, but shows the relevant processes in terms of their mathematical equivalents. In process block 90, the value of s for which functional F is equal to zero is determined. This value is termed $S_0'$ and corresponds to the lower bound of the set of optimal wire separations. In process block 92, the value of s for which functional P is equal to zero is determined. This value is termed $S_0''$ and corresponds to the upper bound of the set of optimal wire separations. At process block 94, it is determined whether $S_0''$ is greater than $S_0'$. In other words, it is determined whether the value calculated as the upper bound is greater than the value calculated for the lower, and thus whether a set of acceptable values of s exist. If $S_0''$ is greater than or equal to $S_0'$, then a set of optimal wire separations is feasible, and this set is output at process block 98. If, however, $S_0''$ is less than $S_0''$, then a set of optimal wire separations is unfeasible, and this result is output at process block 96.

Figure 14:
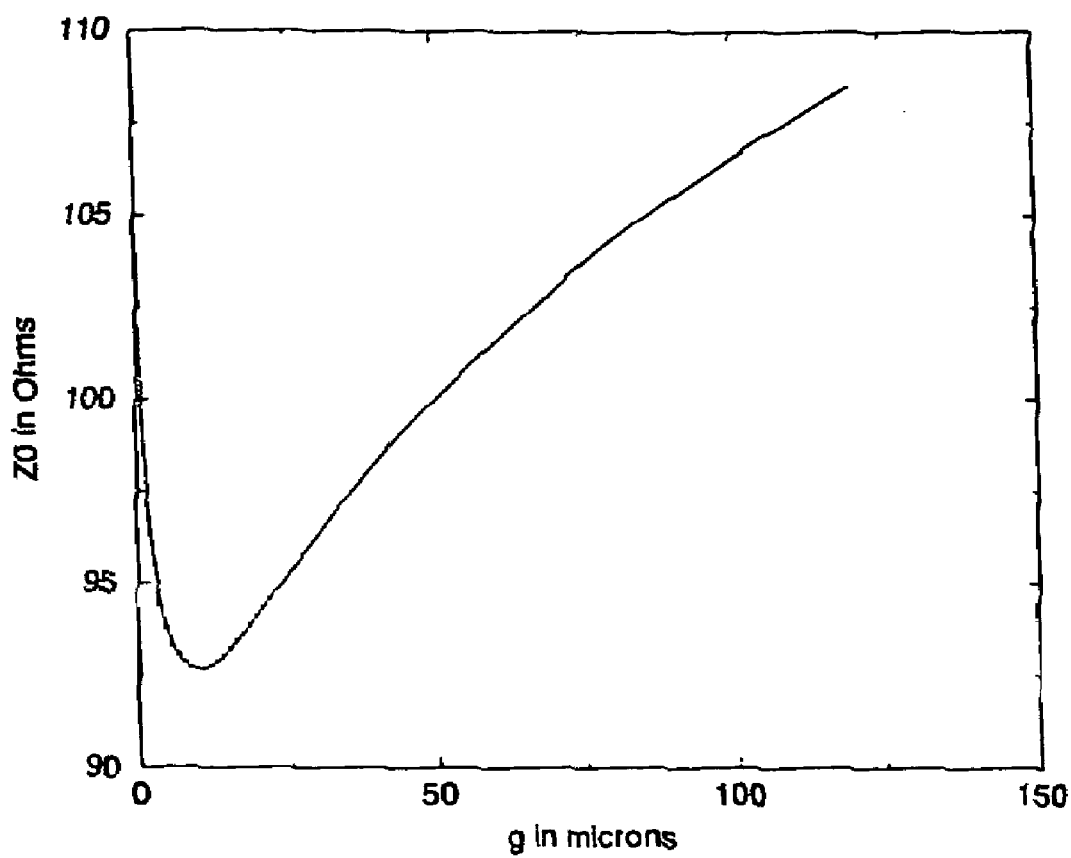
FIG. 14 is a graph showing $Z_0$ as a function of ground wire width g.

The particular method described with respect to FIGS. 4 through 13 of varying wire separation s to achieve the desired rlc parameters in the wiring layout is not intended to be limiting in any way. The method disclosed may be modified by one of ordinary skill in the art so that any one of the physical parameters affecting the inductance of the wiring layout may be optimized to achieve the desirable effects discussed above. For instance, the method may be modified such that an optimal ground wire width g is calculated that allows the wiring layout exhibit transmission-line behavior with signal propagation at approximately the speed of light in the medium of the signal wire. When the ground wire width g is the independent variable, simulations with FastHenry have shown that $Z_0$ as a function of g displays a single minimum (see FIG. 14). Further, F as function of g has at most one point where it vanishes. The interval for g where $F \leq 0$, if it exists, is $[g_F, \lambda/10)$, with $g_F$ the value of g where F vanishes. As shown in FIG. 14, P as a function of g has at most two vanishing points. To find the relevant interval of g, the zeros of P can be found, if they exist, and then the intervals where $P(g) \leq 0$ can be found by inspection.

Figure 15:
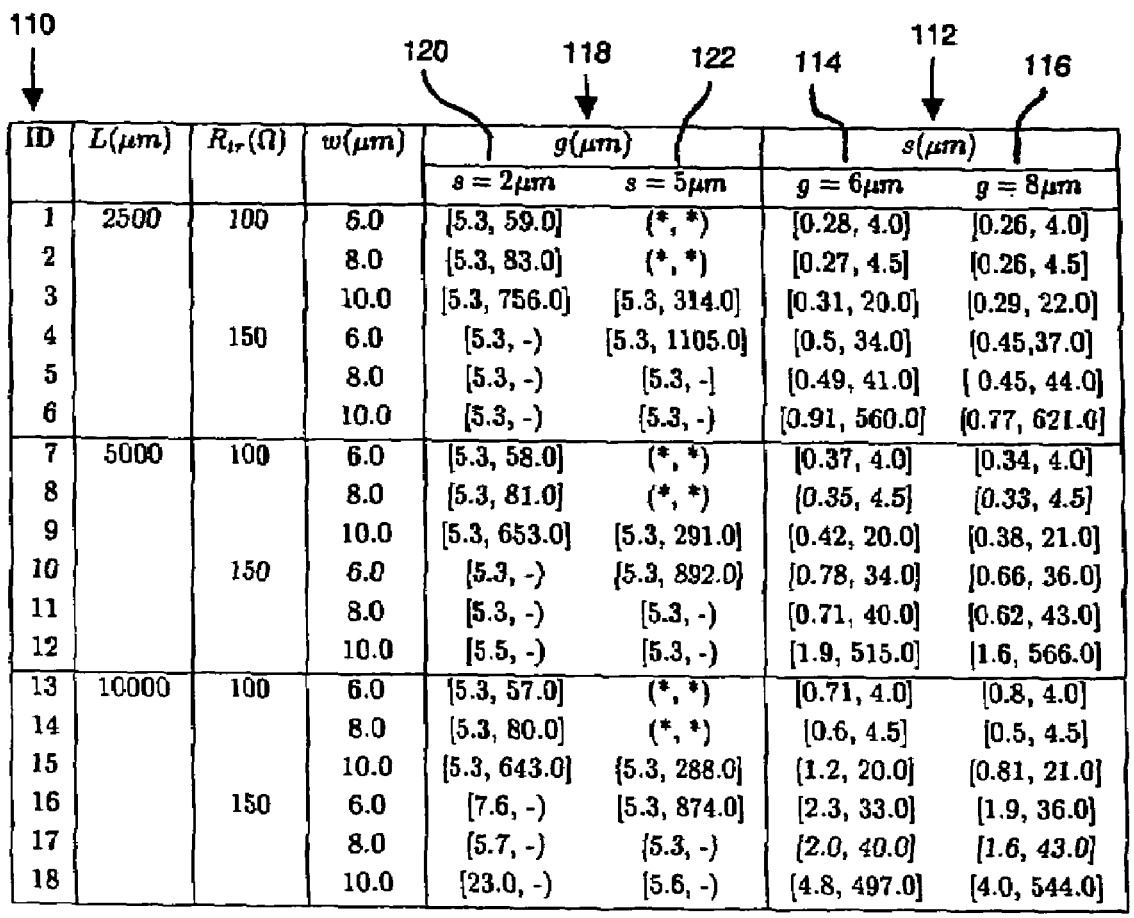
FIG. 15 is an exemplary results table as may be generated using the disclosed method.

FIG. 15 shows an exemplary table produced from the method described above. The table shows the results for various possible sandwich-style wiring layouts. The solutions include sets of optimal wire separations s and sets of optimal ground wire widths g. Column 110 displays the ID number of a particular configuration of line length L, resistance of the driver $R_{tr}$, and signal wire width w. Column 112 displays two sets of optimal wire separations s for each ID number. The first set, shown generally at 114, is the set of optimal wire separations for a ground wire width of 6 μm. The second set, shown generally at 116, is the set of optimal wire separations for a ground wire width of 8 μm. Also shown are sets of optimal ground wire widths calculated for two fixed wire separations. Column 118 displays the two sets of optimal ground wire widths g for each ID number. The first, shown generally at 120, is the set of optimal ground widths for a wire separation of 2 μm. The second set, shown generally at 122, is the set of optimal ground wire widths for a wire separation 5 μm. Thus, for example, for ID number 1, the wire length L for all three of the wires in the layout is 2500 μm, the driver circuit has $R_{tr}$=100 Ohms, and the width of the signal wire w is fixed at 6 μm. For a wire separation between the edge of the signal wire and the edge of either ground wire of 2 μm, there is a continuum of solutions shown in column 118 for the width of the ground wire g starting at 5.3 μm and ending at 59.0 μm. For a wire separation of 5 μm, however, there are no feasible solutions, which is denoted by (*,*). Additionally, some configurations shown have a solution of optimal ground wire width with an upper limit bounded by 0.1λ, where λ is the wavelength of the electromagnetic signal propagating on the signal line, which is denoted by (−).

C. Selecting a Wire Separation From the Solution Interval

Figure 16:
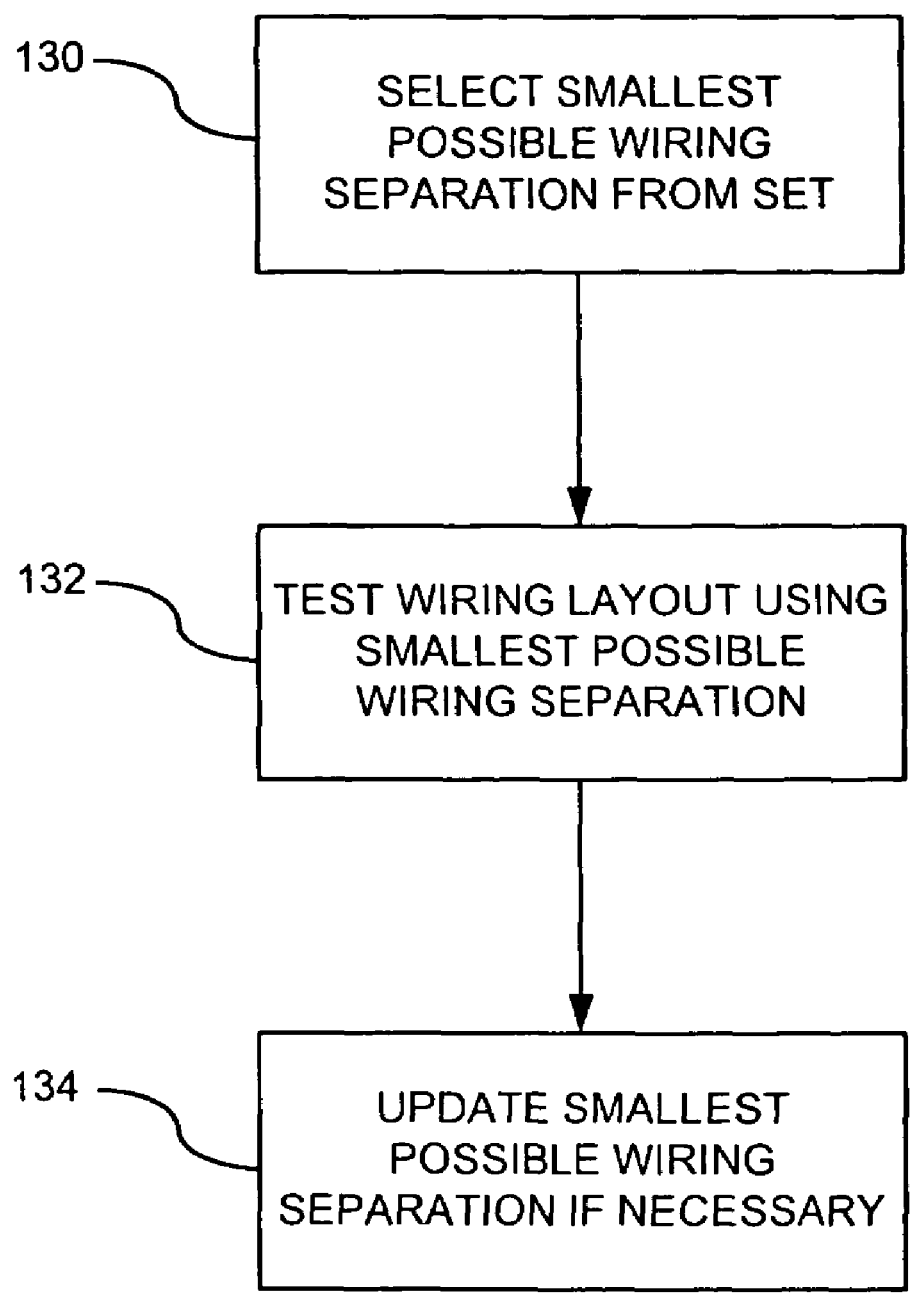
FIG. 16 is a flowchart for selecting a wire separation s from a set of optimal wire separations.

FIG. 16 shows a method of selecting a wire separation from the solution interval of wire separations as may be used in process block 48 of FIG. 4. In process block 130, the smallest possible wiring separation is selected from the solution interval of wire separations (s', s"), i.e. s'. In process block 132, the wiring layout is tested using the smallest possible wiring separation selected. This testing may be performed using a 3-D simulator configured to test the layout at the maximum frequency of interest. In process block 134, the smallest possible wiring separation is updated if the testing at process block 132 determines that the wiring layout was not acceptable. This update may adjust the physical parameters of the wiring layout to account for certain frequency-dependent effects. Specifically, well-understood phenomena, such as the proximity effect, skin effect, and dielectric relaxation, can affect the rlc parameters of the layout. These effects are discussed in greater detail below.

IV. Possible Corrections
  A. Rise Time Corrections

Davis and Meindl derived the following expression for $V_{fin}(x,t)$, which is the output solution to a Heaviside pulse:

$$V_{fin}(x,t) = 2V_{inf}(x,t) + 2V_{dd}\frac{Z_0}{Z_0+R_{tr}}e^{-\sigma t}\sum_{n=1}^{q}\sum_{i=0}^{n}\sum_{j=0}^{\infty}\frac{n(n-1+j)!}{i!j!(n-i)!}(-1)^i\Gamma^{n-i+j} \times$$

$$\left\{\begin{array}{l}\left(\frac{t-(2n+1)x\sqrt{lc}}{t+(2n+1)x\sqrt{lc}}\right)^{(i+j)/2} I_{i+j}\left(\sigma\sqrt{t^2-((2n+1)x\sqrt{lc})^2}\right) \\ +\frac{1}{1-\Gamma}\sum_{k=1}^{\infty}\left(\frac{t-(2n+1)x\sqrt{lc}}{t+(2n+1)x\sqrt{lc}}\right)^{(i+j+k)/2} I_{i+j+k}\left(\sigma\sqrt{t^2-((2n+1)x\sqrt{lc})^2}\right)(4-(1+\Gamma)^2\Gamma^{k-1})\end{array}\right\} \times$$

$$u_0(t-(2n+1)x\sqrt{lc}).$$

(24)

where $$q = \left\lfloor 0.5\left(\frac{t}{x\sqrt{lc}}+1.0\right)\right\rfloor$$

(25)

with, $$V_{inf}(x,t) = V_{dd}\frac{Z_0}{Z_0+R_{tr}}e^{-\sigma t} \times$$

$$\left\{\begin{array}{l}I_0\left(\sigma\sqrt{t^2-(x\sqrt{lc})^2}\right) \\ +\frac{1}{1-\Gamma}\sum_{k=1}^{\infty}\left(\frac{t-x\sqrt{lc}}{t+x\sqrt{lc}}\right)^{\frac{k}{2}} I_k\left(\sigma\sqrt{t^2-(x\sqrt{lc})^2}\right)(4-(1+\Gamma)^2\Gamma^{k-1})\end{array}\right\} \times u_0(t-x\sqrt{lc}),$$

(26)

with $\Gamma=(R_{tr}-Z_0)/(R_{tr}+Z_0)$, $\sigma=r/(2l)$, $I_k(-)$ the modified Bessel function of ord k-th.

As used herein, $V_{DM}(t):=V_{fin}(L,t)$. From general theorems of linear partial differential equations it is well known that the output $V_{out}(t)$ for a general input signal $I(t)$ is given by:

$$V_{out}(t) = \frac{d}{dt}(V_{DM}(t)*I(t)).$$

(27)

The operator "*" is the convolution product:

$$f(t)*g(t) = \int_{-\infty}^{\infty} f(\tau)g(t-\tau)d\tau.$$

(28)

Consider for I(t) the form:

$$I(t) = \begin{cases} 0 & \text{if } t \leq 0 \\ \frac{t}{T_{rise}} & \text{if } 0 < t \leq T_{rise} \\ 1 & \text{if } t > T_{rise} \end{cases}$$

(29)

The response $V_{out}$ to I becomes (from equation (27)):

$$V_{out}(t) = \int_{-\infty}^{\infty} V_{DM}(\tau)\frac{dI(t-\tau)}{dt}d\tau.$$

(30)

The derivative of $I(t-\tau)$ is equal to $1/T_{rise}$ for $t-T_{rise}<\tau<t$ and is zero elsewhere. Therefore, $$V_{out}(t) = \frac{1}{T_{rise}}\int_{t-T_{rise}}^{t} V_{DM}(\tau)d\tau.$$

(31)

Figure 17:
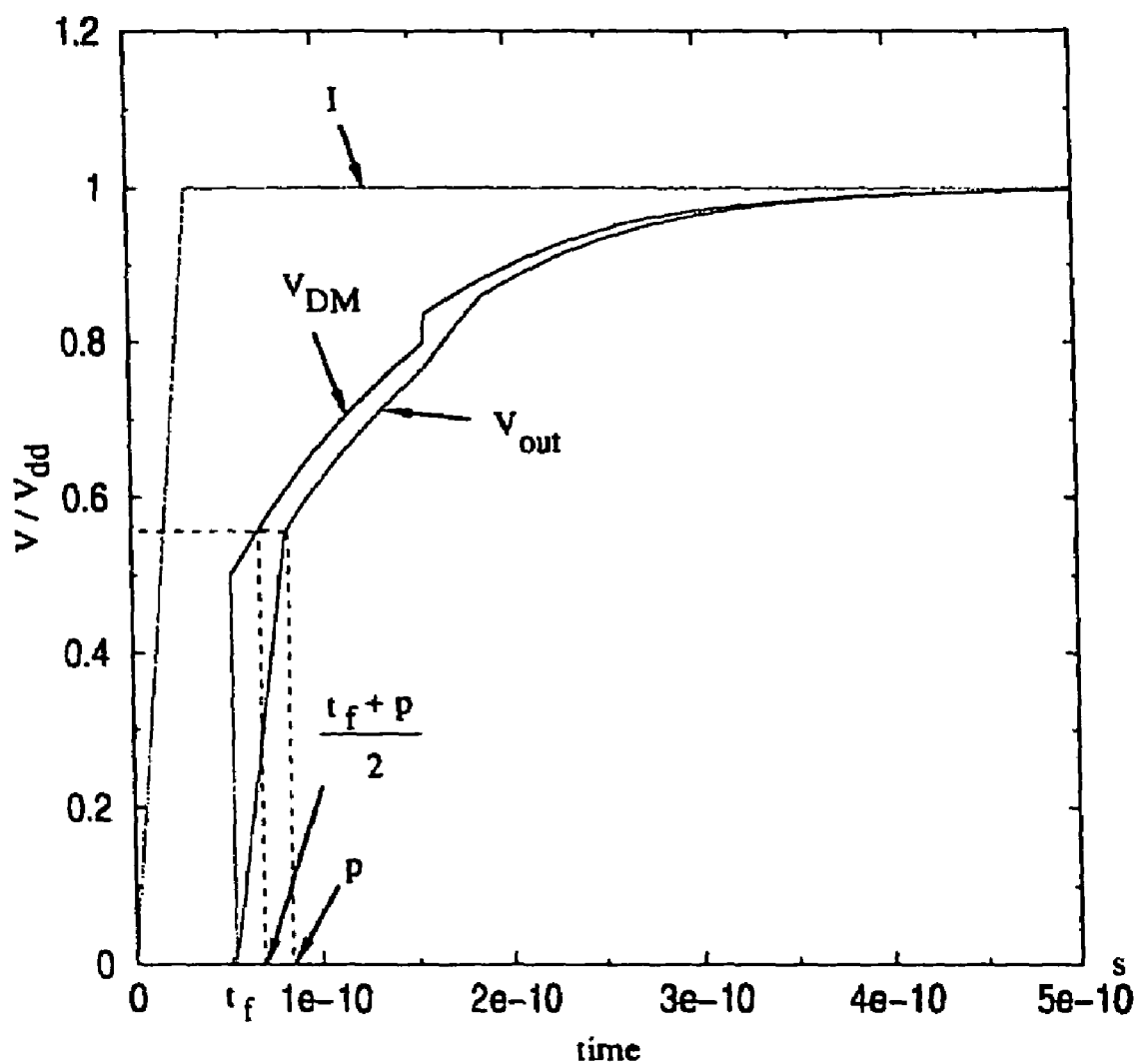
FIG. 17 is a graph showing the output of an input signal after correcting the rise time.

The parameters in equation (24) are taken such that the configuration is in Region I, and numerical integration with equation (31) is performed. Results are shown in FIG. 17. Notice that $V_{out}(t)$ has a discontinuity in its first derivative at a point p that will be identified. For this purpose, the first derivative of $V_{out}$ is examined by differentiation of equation (31):

$$\frac{dV_{out}(t)}{dt} = \frac{1}{T_{rise}}[V_{DM}(t) - V_{DM}(t - T_{rise})], \quad (32)$$

It has its first two discontinuities at $t=t_f$ and $t=t_f+T_{rise}$, since $V_{DM}$ has a discontinuity at $t=t_f$. It can then be concluded that: $p=t_f+T_{rise}$.

From equation (31):

$$V_{out}(t_f + T_{rise}) = \frac{1}{T_{rise}} \int_{t_f}^{t_f+T_{rise}} V_{DM}(\tau) d\tau. \quad (33)$$

The linear approximation for $V_{DM}(t)$ in $t \in (t_f, t_f+T_{rise})$ is taken. From the mean value theorem, it follows that:

$$V_{out}(t_f + T_{rise}) \approx V_{DM}\left(t_f + \frac{T_{rise}}{2}\right). \quad (34)$$

The result is exact in the linear approximation.

Consider now the linear approximation to $V_{out}(t)$ in the same interval:

$$V_{out}(t) \approx \frac{V_{DM}(t_f + T_{rise}/2)}{T_{rise}}(t - t_f). \quad (35)$$

Impose $V_{out}(t)=0.5 V_{dd}$, which is feasible since solutions in Region I were taken, and obtain:

$$t_{50\%} = t_f + \frac{T_{rise}}{2}\left(\frac{V_{dd}}{V_{DM}(t_f + T_{rise}/2)}\right), \quad (36)$$

which is the new expression for the 50% time delay. Equation (36) improves significantly over the naive shift in the delay computation $t=t_f+T_{rise}/2$. The expression has been derived for $T_{rise}<4t_f$ since at this point new discontinuities appear in $V_{DM}(t)$.

It has been verified numerically that the relative error incurred in the delay calculation, resulting from the linear approximations presented above, is very small for $T_{rise} \leq 2t_f$. The error increases with $T_{rise}$, and for $T_{rise}=2t_f$ is a reasonable 3%. The error becomes large by the time the upper limit $T_{rise}=4t_f$ is reached. Transmission-line behavior, which is identified with equation (36), demands:

$$T_{rise} \leq 2\sqrt{cL}. \quad (37)$$

Equation (36) is a solution to the delay estimate for a signal in Region I for $T_{rise}<2t_f$.

Fixing $T_{rise}$ in equation (36), the L dependence displays both linear and quadratic behavior, at variance with the zero rise time solution. It is a second bound for a signal in Region I and makes the quadratic term negligible. A subsidiary consequence of finite $T_{rise}$ is the relaxation of the overshoot constraint $Z_0 \leq R_{tr}$. Corrections due to a finite clock period in equation (36) are negligible for a clock period of reasonable bandwidth (a clock period larger than $6T_{rise}$.)

B. Corrections for Frequency-Dependent Effects

In general, rlc parameters are frequency dependent in accordance with well-understood phenomena: proximity, skin effect, and dielectric relaxation. The range of frequencies that are of concern is determined by the rise time of the signal. The frequency spectrum will contain appreciable content up to a frequency given by:

$$f_{max} = \frac{1}{\pi T_{rise}}. \quad (38)$$

This is the view of the $T_{rise}$-related phenomena in terms of the Laplace coordinates. The rise time $T_{rise}$ is determined by technology and circuit considerations. For example, technology may determine the transistor delay to be $\tau_{tr} \approx 2$ ps at 130 nm. The $T_{rise}$ of the signal is determined by the underlying logic feeding the line. For example, $T_{rise}$ may be approximately 30 ps at 130 nm. Based on these exemplary numbers and equation (38), the signal spectrum will be appreciable up to a maximum frequency O(10) GHTz. Using these figures, possible corrections to the constant r and l assumption to account for the skin effect and the proximity effect are considered.

The parameter that controls the skin effect is the magnetic field penetration on the metal δ, which results from one-dimensional solutions to Maxwell's equations on a conductor media and is given by:

$$\delta = \sqrt{\frac{1}{\mu_0 f \sigma}}. \quad (39)$$

To minimize its influence, meaning full penetration of the magnetic field on the metal and as such uniform current distribution, the thickness of the metal layer h is taken as h<2δ with δ≈0.7 μm for Cu at 10 GHTz. One-dimensional treatment of skin depth is not completely persuasive in two dimensions. Therefore, the consistency is checked via accurate simulations. There also exists the simultaneous need to minimize r, which itself calls for thicker h. Thus, a compromise of h≈δ is used. In this example, h is set to 650 nm. Simulations run using FastHenry have verified that skin effect corrections are in fact negligible up to 10 GHTz. With regards to c, the frequency regime where dielectric response times are comparable to the rise times of signals is above the region of interest.

Another factor responsible for frequency variation of the parameters is the proximity effect. Its main effects are to increase r and decrease l as a function of f. The modifications to the constant parameter assumption can be significant for wide wires separated by short distances. The partial-self-inductance contribution is the most sensitive to proximity effects, since the current on each wire tends to redistribute towards the surfaces closer to the neighbor wires. The classic quasi-static treatment discussed above in section III.A.1 may be replaced by FastHenry simulations. For example, the partial self inductance for wires described in FIG. 15 can decrease up to 4% from the quasi-static values. The variation in mutual inductance is less than 1% for the entire configuration represented in FIG. 15. As a consequence of these two effects, table 1 shows that the loop inductance can decrease to a maximum of 6% for frequencies up to 10 GHTz.

TABLE 1

% Decrease in l From Quasi-Static to 10 GHTz.
(h = 0.65 μm, w = 10 μm, s = max{w, g})

| g (in μm) | % decrease in l |
|---|---|
| 10 | 5.1% |
| 15 | 5.2% |
| 30 | 4.9% |
| 50 | 4.5% |

As shown in table 2, the r variation due to the same physical effect is larger than the corresponding reactance variation.

TABLE 2

% Decrease in r From Static Value to 10 GHTz.

| g (in μm) | % increase in r |
|---|---|
| 10 | 25% |
| 15 | 26% |
| 30 | 26% |
| 50 | 25% |

The net result on the solution space is that an increase of $r(\omega)$ and a decrease of $l(\omega)$ makes inequality (3) more restrictive.

The impact on the solution intervals when proximity effects are included can be verified using FastHenry. Specifically, using a collection of configurations from FIG. 15 and their respective solution intervals of s, FastHenry can be used to compute the parameters r and l for a given value of s in the interval at the maximum frequency considered, 10 GHTz. The resulting parameters can then be analyzed to determine if inequality (3) is satisfied.

The net modification for a given interval in s, $(s_1, s_2)$, and given w and g, is to increase $s_1$ so as to compensate for the increase in r and the decrease in l. Naturally the effect is more pronounced for longer wires. Table 3 shows the modified results.

TABLE 3

Renormalization of $s_1$ (from FIG. 15)
When Proximity Effects are Considered (g = 6 μm)

| ID | old $s_1$ (in μm) | new $s_1$ (in μm) |
|---|---|---|
| 1 | 0.28 | 0.33 |
| 7 | 0.37 | 0.56 |
| 13 | 0.71 | 1.8 |

Notice that the existence and nature of the solution space does not change. Solutions exist in the presence of proximity effects for lengths on the cm scale. The absolute value of the upper limit depends on specific details of the technology, and the particular wires under consideration. The lower limits, on the other hand, are exclusively dictated by equation (37), which only depends on the technology, L≦1 mm for 130 nm.

V. Reflections

A. Reflections in General

The principles of the method discussed above may also be used to help minimize some of the deleterious effects that are inherent in signal propagation in an SBHT. Specifically, the physical parameters of the wire layout may be altered to minimize reflections of the signal that are caused by discontinuities in the signal line. In a SBHT, reflections occur at the junctions of the tree where an upstream branch is coupled in parallel with downstream branches. The magnitude of the reflection is determined by the difference between signal line impedances at the junction. Thus, to eliminate the effects of reflection, the impedance of the downstream branches should be matched with the impedance of the upstream branch. As discussed above, the impedance of a branch in a SBHT is a function of the rlc parameters of the wiring layout and can be altered by modifying the physical parameters of the layout design. Thus, by adjusting the appropriate physical parameters of downstream SBHT branches to match the impedance of an upstream branch, it is possible to minimize the effects of reflections. This process can be performed iteratively on multiple downstream branches to minimize reflection effects throughout a series of branches in an SBHT. At the deeper levels of the tree, however, the physical parameters required to match the impedance of the original branch might become unacceptably large. Thus, the insertion of a repeater may be required to restore the signal to its original voltage value.

B. Impedance Matching

Given a SBHT of depth n. The magnitude of the reflection at each junction is determined by the impedance mismatch at the boundary. Because the junction of a SBHT has two downstream branches coupled in parallel to an upstream branch, to equalize the impedance, and thus eliminate reflections, each one of the downstream branches must have:

$$Z_i = 2Z_{i-1} = \ldots = 2^i Z_0 \text{ for } i=1,\ldots,n \quad (40)$$

where the subindex i characterizes the depth of the tree.

Now, $$Z_i = Z_{i,0}\sqrt{\frac{p + \frac{r_i}{l_i}}{p}}, \quad (41)$$

with $$Z_{i,0} = \sqrt{\frac{l_i}{c_i}},$$

and p the Laplace complex variable.

The following high frequency approximation is made: $Z_i \approx Z_{i,0}$. This is an accurate approximation for the high frequency part of the impedance. Since $p=j2\pi f_{max}$ with $f_{max} \approx 10$ GHTz, the error in the approximation is small. The impedance is matched based on its high frequency component, since it is the high frequency regime that is the one responsible for the linear time-of-flight behavior of the delay (in other words the small t behavior). For routing purposes, common w and g on all branches are maintained, (i.e., r is the same for all branches). Notice that at the junctions, equation (40) does not need to be satisfied for resistance matching.

To minimize reflections for fixed w and g, $s_i$ is varied from one level of the tree to the next in such a way as to satisfy equation (40). The modification demanded by impedance matching on the previous analysis translates into an iterative process, which is explained in greater detail below with reference to FIG. 18. The first step consists of choosing a driver's strength $R_{tr}$ feeding the main branch and finding its solution interval $(s_{0,1}, s_{0,2})$. Then, choosing a value $s_0$ belonging to this interval and subsequently finding the values of $s_i$ for the remaining levels using equation (40). Notice that the appropriate $L_n$ that enters into the equation is the sum of the Ls corresponding to the father plus those corresponding to the sons up to the leaf.

The length $L_n$ is calculated using the following expression:

$$L_n = \sum_{i=0}^{n} L_{n,i}, \qquad (42)$$

where $$L_{n,i} = \begin{cases} \dfrac{L_w}{2^{\lfloor(i+1)/2\rfloor+1}} & \text{if } i \text{ is even} \\ \dfrac{L_h}{2^{(i+1)/2+1}} & \text{if } i \text{ is odd} \end{cases} \qquad (43)$$

with $L_w$, $L_h$ the dimensions of the rectangle where the SBHT is embedded.

C. Repeater Insertion

Since trees with multiple branches typically cannot maintain a sufficiently high voltage for transmission-line propagation after two or three junctions, repeaters are needed. The criteria for repeater insertion is qualitatively similar in the rc and rlc domains. It is that of ensuring that the quadratic term in L in the time delay expression is negligible. In the regime where transmission-line effects are important (where the line in fact decouples the receiver from the driver within the time delay), it is reasonable to consider the open-ended line configuration. The criteria for selecting repeater size in the lines will be entirely different than in the rc domain. The maximum length permissible for time-of-flight computation is somewhat smaller than the optimal length of repeater insertion in the rc domain. Both of these lengths are computed with the same criteria in mind, that of ensuring that the linear term in the time domain be dominant with respect to the quadratic term. The controlling variable is:

$$\psi = \frac{rL}{2Z_0}. \qquad (44)$$

Representative values for $\psi$ might range, for instance, from 0.05 to 0.48. The size requirements for repeaters are different in both regimes. Repeater size determination in the presence of transmission lines is governed by impedance matching and the absence of overshoots and undershoots. In the absence of the latter, driver size is dictated by equation (40), which indicates smaller drivers downstream. The mechanism for repeater insertion, which is described in detail below with respect to FIG. 18, may result in repeaters being placed from source to destinations at half of the junctions.

Figure 18:
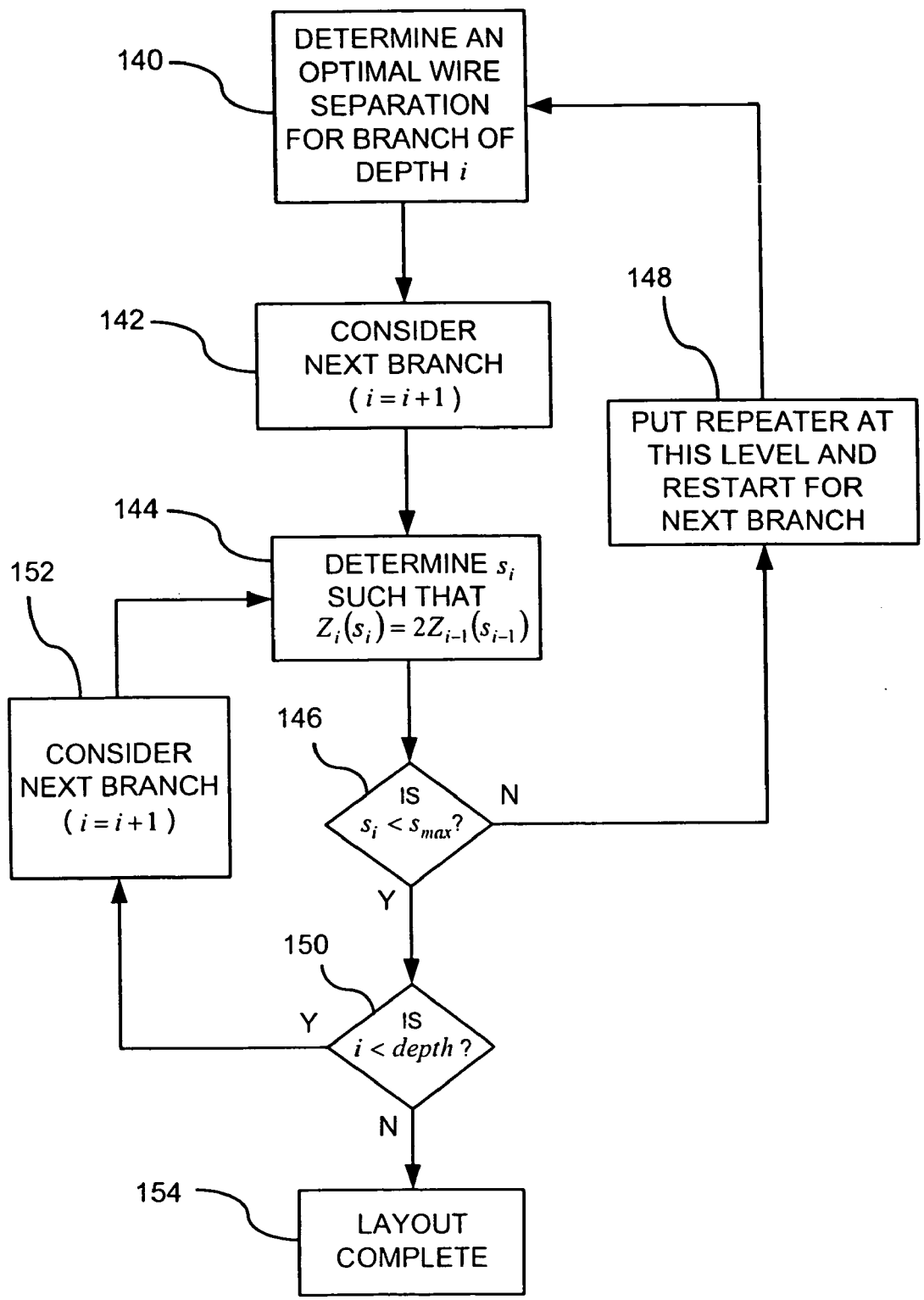
FIG. 18 is a flowchart for matching the impedance of a downstream branch in a sandwich balanced H-tree and for properly inserting repeaters.

FIG. 18 shows a flowchart of a method for minimizing reflections and placing repeaters in a SBHT. At process block 140, an optimal wire separation for a current branch is determined. The current branch may be the first branch in a SBHT clock tree (i.e., the branch coupled with the clock source) or the branch in a SBHT clock tree that is coupled directly to a repeater used to restore the signal. At process block 142, the current branch being considered is updated to the next branch in the tree. Thus, the depth of the current branch is updated so its depth i=i+1. At process block 144, a wire separation of the current branch is determined such that the impedance of the current branch matches the impedance of the previous branch. For instance, for a SBHT layout where an upstream branch is coupled in parallel with two downstream branches, the impedance $Z_i$ of the current downstream branch must be twice the impedance of the adjacent upstream branch $Z_{i-1}$. In other words, $Z_i(s_i)=2Z_{i-1}(s_{i-1})$. At process block 146, a determination is made as to whether the wire separation $s_i$ calculated for the current branch is less than the maximum possible wire separation for the SBHT $s_{max}$. The value for $s_{max}$ may be 0.1λ, where λ is the wavelength of the electromagnetic signal propagating on the signal line. The value for $s_{max}$ may also be found by considering other physical manufacturing restraints on the SBHT. If it is found that $s_{max}$ is less than $s_i$, then it is not possible to configure the current branch of the SBHT using the wire separation $s_i$ calculated at process block 144. Thus, in process block 148, a repeater is inserted at the beginning of the branch in order to restore the signal voltage to its original value. The method for minimizing reflections is then repeated beginning with the current branch on which the repeater is placed. Because the repeater restores the signal voltage on the current branch to the signal's original value, the method may be restarted as if the current branch were the first branch in the tree. If it is found that $s_{max}$ is less than $s_i$, then the value of $s_i$ calculated at process block is acceptable. At process block 150, a determination is made as to whether there are any remaining branches to be considered. In other words, a determination is made as to whether the current depth being considered (i) is less then than the total depth of the wiring layout (depth). If there are remaining branches to be considered, then at process block 152, the current branch being considered is updated to the next branch in the tree. In other words, the depth of the current branch is updated so current depth i=i+1. The impedance matching process at process block 144 is then repeated for the next branch. If it is determined that there are no remaining branches to be considered, then at process block 154, the wiring layout is complete and all branches have either matching impedances with the adjacent branches or have a repeater that restores the signal voltage to its original value.

Figure 19:
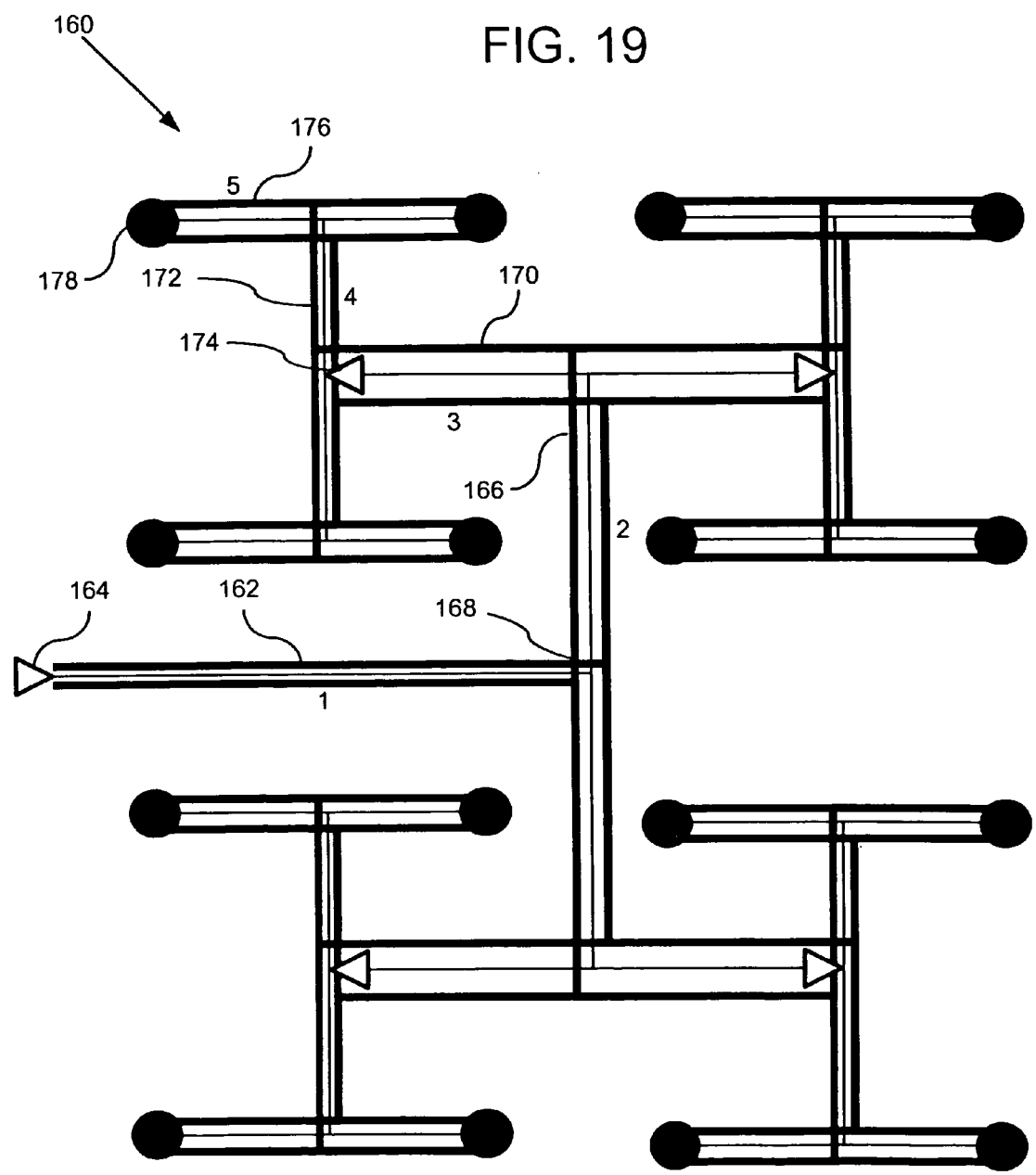
FIG. 19 is an overview of five branches of a sandwich balanced H-tree clock tree that have been configured according to the method in FIG. 18.

FIG. 19 shows an exemplary wiring layout as configured by the method outlined in FIG. 18. A wiring layout 160 is shown that comprises a SBHT having a depth of five branches. A first branch 162 is denoted as having a depth of one. First branch 162 is coupled with a signal-source 164, which may be an independent signal source (e.g., a clock source) or a repeater coupled with an upstream branch (not shown). First branch 162 is coupled in parallel with two other branches, including second branch 166, at a junction 168. Second branch 166 is denoted as having a depth of two. In order to minimize the reflection effects at junction 168, the impedance of the two branches are matched with the impedance of the first branch through the method outlined in FIG. 18. Thus, as is shown in FIG. 19, the wire separation s of the second branch is different than the wire separation of the first branch. A third branch 170, denoted as having a depth of three, is similarly coupled with and configured to match the impedance of second branch 166. A fourth branch 172, denoted as having a depth of four, is coupled with third branch 170. A repeater 174 is inserted at the beginning of the fourth branch to restore the signal propagated on the signal wire. In accordance with the method outlined in FIG. 18, a repeater is inserted because the wire separation s calculated to match the impedance of the third branch 170 exceeds a maximum wire separation $s_{max}$. The method of FIG. 18 is then repeated using the fourth branch 172 as the initial branch for which an optimal wire separation is calculated using the method outlined in FIG. 4. A fifth branch 176 is coupled with and configured to match the impedance of fourth branch 172. Fifth branch 176 may then be coupled to various leaf nodes 178 that may connect with various other digital elements or combinations of elements (not shown). The leaf nodes may be connected to grids that have such a small scale that inductance effects are negligible. The delay contribution arising from the short branches in the grids can be adjusted using more traditional methods (e.g., resistance matching, buffer insertion near the destinations, etc.).

VI. Additional Considerations

The method described above for a simple sandwich configuration can be modified to account for the presence of multiple (same length) ground wires using the uniform current approximation. Specifically, in the presence of extra ground wires, the loop resistance of a signal wire connected to n ground wires in parallel becomes:

$$r_{loop} = r_s + r_{GND}, \quad (45)$$

where $rGND = (r_{g1}^{-1} + \ldots + r_{gn}^{-1})^{-1}$ and $r_{gi}$ is the resistance of the ground wire i.

Similarly, the loop inductance becomes:

$$l_{loop} = \sum_{i=0}^{n} \alpha_i \sum_{j=0}^{n} \alpha_j l_{i,j}, \quad (46)$$

with $$\alpha_0 = 1 \text{ and } \alpha_i = \frac{-r_{GND}}{r_{gi}} \text{ for } i > 0.$$

Equations (45), (46) approach equations (6), (7), respectively, when the closer wires are those of minimum resistance (i.e., the wider ones). The replacement of equations (6), (7) with equations (45), (46) is simply an implementation detail. The c results are insensitive to the presence of non-nearest-neighbors ground wires on the same layer, due to shielding.

VII. Use of a Client-Server Network

Figure 20:
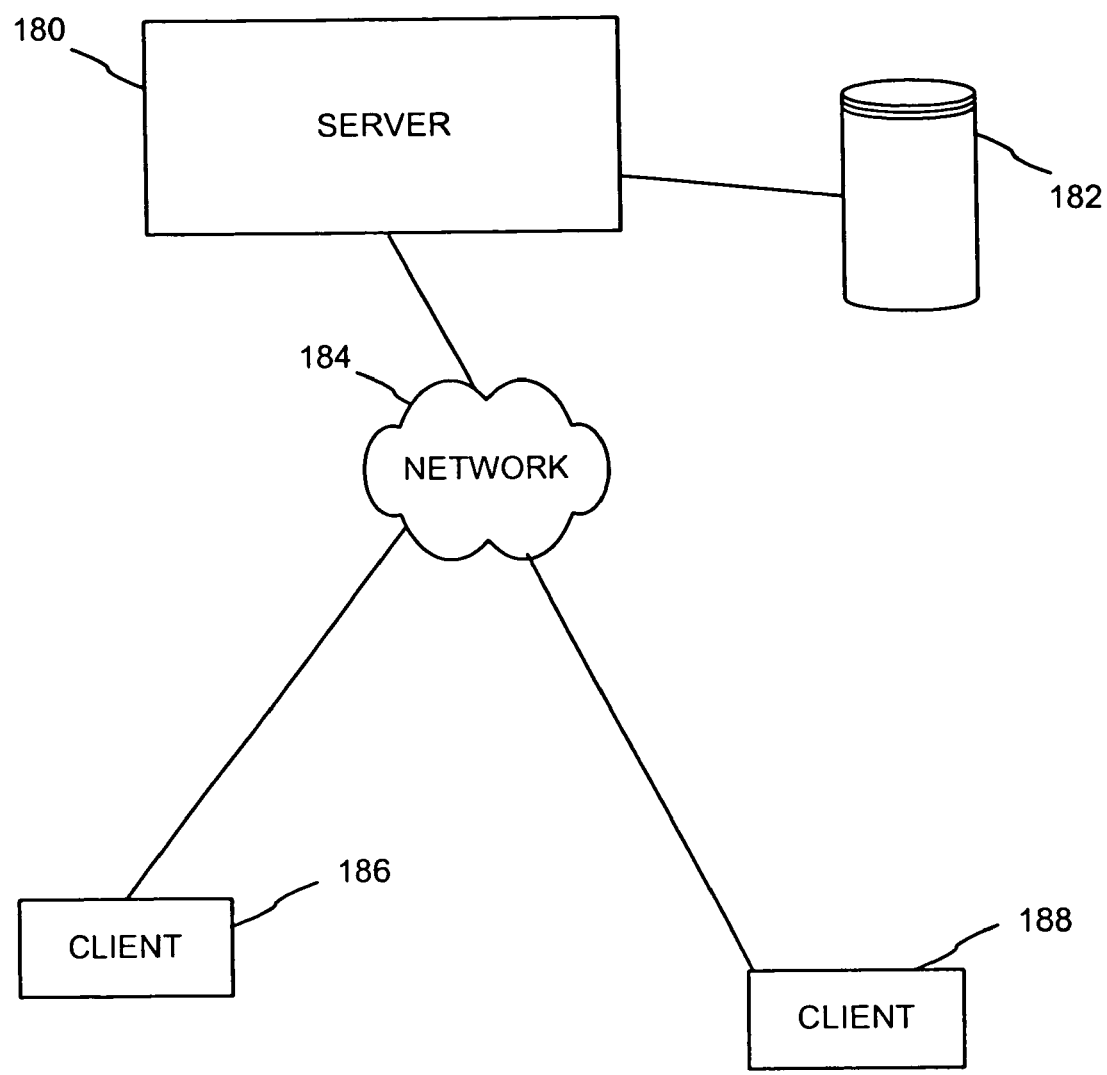
FIG. 20 is a schematic diagram showing a client-server network that may utilize the disclosed method of configuring a wiring layout.

Any of the aspects of the method described above may be performed in a distributed computer network. FIG. 20 shows an exemplary network. A server computer 180 may have an associated database 182 (internal or external to the server computer). The server computer 180 may be configured to perform any of the methods associated with the above embodiments. The server computer 180 may be coupled to a network, shown generally at 184. One or more client computers, such as those shown at 186, 188, may be coupled to the network 184 and interface with the server computer 180 using a network protocol.

Figure 21:
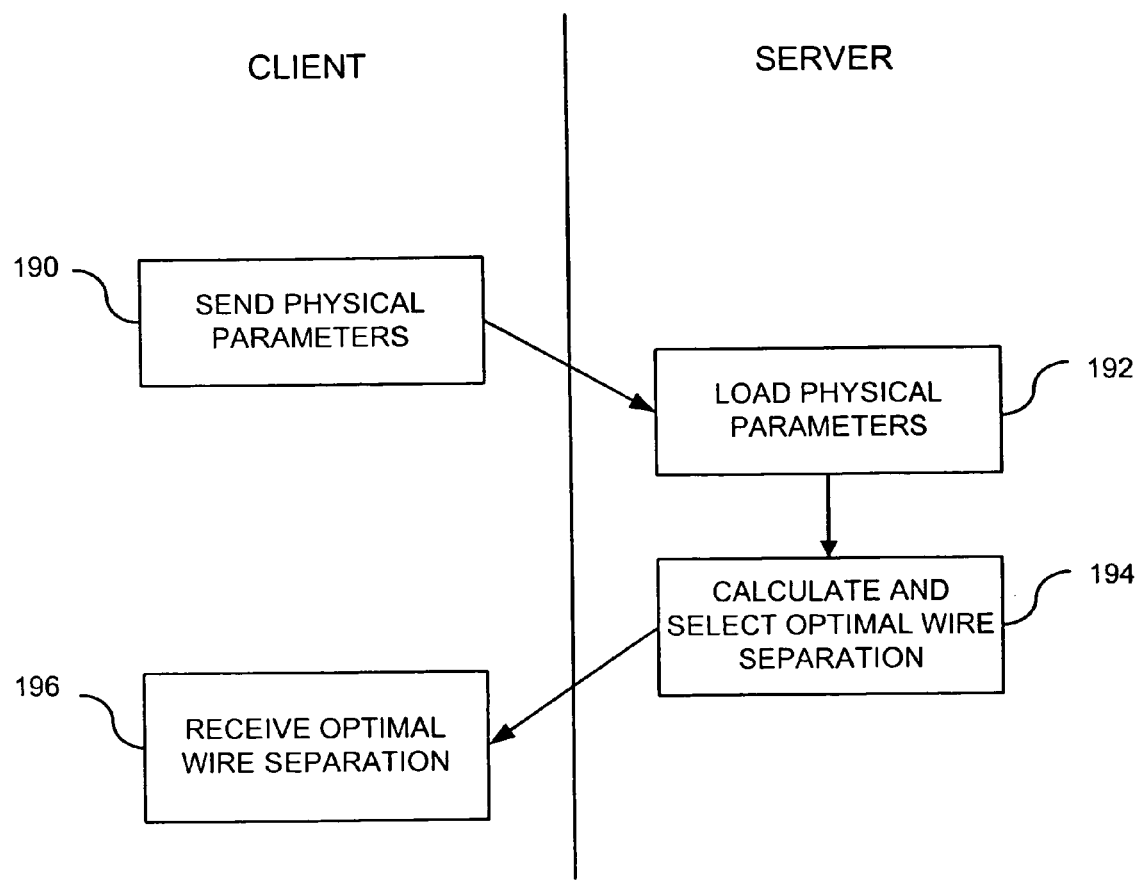
FIG. 21 is a flowchart showing the use of the disclosed method in the client-server network shown in FIG. 20.

FIG. 21 shows that a wiring layout may be configured according to the disclosed method using a remote server computer, such as a server computer 180 in FIG. 30. In process block 190, the client computer sends data relating to the physical parameters of the wiring layout for which an optimal wiring separation is to be calculated. In process block 192, the data is received and loaded by the server computer. In process block 194, the method disclosed above is performed and an optimal wire separation is calculated and selected. In process block 196, the client computer receives the optimal wire separation sent by the server computer.

Having illustrated and described the principles of the illustrated embodiments, it will be apparent to those skilled in the art that the embodiments can be modified in arrangement and detail without departing from such principles.

For example, the method may be used to design a wiring layout having any number of ground wires or ground surfaces surrounding a signal wire. For instance, there may be a single grounding surface surrounding the wire or there may be three or more ground surfaces surrounding the wire. Further, the method may be used to design any wiring layout for which it is desirable to have propagation at approximately the speed of light in the medium and transmission-line behavior. Moreover, if the wiring layout is a clock tree, the clock tree may have various other designs. The clock tree may have, for instance, a clock-grid design or a length-matched serpentine design.

In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. A computer-implemented method of configuring a wiring layout in an integrated circuit design, comprising:

analyzing at least a portion of the wiring layout in the integrated circuit design, the wiring layout portion having a signal wire and one or more ground wires defined by multiple physical parameters; and adjusting one or more of the physical parameters in order to create non-negligible inductance effects in the wiring layout portion that are calculated to produce a desired time delay for signal propagation on the signal wire of the wiring layout portion, wherein the act of analyzing comprises calculating an rlc relationship between the signal wire and the one or more ground wires that produces the desired time delay for signal propagation, where r corresponds to a loop resistance per unit length of the signal wire, l corresponds to a loop inductance per unit length of the signal wire, and c corresponds to a total capacitance per unit length of the signal wire, and wherein the act of adjusting comprises changing a physical parameter of the wiring layout portion so that the wiring layout portion exhibits the rlc relationship.

2. The method of claim 1, wherein at least one of the adjusted physical parameters is a width of one of the ground wires or the signal wire.

3. The method of claim 1, wherein at least one of the adjusted physical parameters is a wire separation between the signal wire and one of the ground wires.

4. The method of claim 1, wherein at least one of the adjusted physical parameters is a metal layer thickness of one of the ground wires or the signal wire.

5. The method of claim 1, wherein at least one of the adjusted physical parameters is a length of the signal wire.

6. The method of claim 1, wherein the wiring layout is a clock tree.

7. The method of claim 1, wherein the adjusting is performed so that the wiring layout portion exhibits transmission-line behavior.

8. A circuit having a wiring layout configured by the method of claim 1.

9. The method of claim 1, wherein the calculating includes calculating a wire separation between the signal wire and the one or more ground wires that creates the rlc relationship.

10. The method of claim 1, wherein the ground wires are not equally spaced from the signal wire.

11. The method of claim 1, wherein the rlc relationship enables the wiring layout portion to exhibit transmission-line behavior.

12. A circuit having a wiring layout configured by the method of claim 11.

13. A computer-readable medium storing computer-executable instructions for causing a computer to perform a method, the method comprising:

analyzing at least a portion of a wiring layout in an integrated circuit design, the wiring layout portion having a signal wire and one or more ground wires defined by multiple physical parameters; and adjusting one or more of the physical parameters in order to create non-negligible inductance effects in the wiring layout portion that are calculated to produce a desired time delay for signal propagation on the signal wire of the wiring layout portion, wherein the act of analyzing comprises calculating an rlc relationship between the signal wire and the one or more ground wires that produces the desired time delay for signal propagation, where r corresponds to a loop resistance per unit length of the signal wire, l corresponds to a loop inductance per unit length of the signal wire, and c corresponds to a total capacitance per unit length of the signal wire, and wherein the act of adjusting comprises changing a physical parameter of the wiring layout portion so that the wiring layout portion exhibits the rlc relationship.

14. The computer-readable medium of claim 13, wherein at least one of the adjusted physical parameters is a width, length, wire separation, or metal layer thickness of one of the ground wires or the signal wire.

15. The computer-readable medium of claim 13, wherein the wiring layout is a clock tree.

16. The computer-readable medium of claim 13, wherein the adjusting is performed so that the wiring layout portion exhibits transmission-line behavior.

17. A system, comprising:

means for analyzing at least a portion of a wiring layout in an integrated circuit design, the wiring layout portion having a signal wire and one or more ground wires defined by multiple physical parameters; and means for adjusting one or more of the physical parameters in order to create non-negligible inductance effects in the wiring layout portion that are calculated to produce a desired time delay for signal propagation on the signal wire of the wiring layout portion, wherein the means for analyzing includes means for calculating an rlc relationship between the signal wire and the one or more ground wires that produces the desired time delay for signal propagation, where r corresponds to a loop resistance per unit length of the signal wire, l corresponds to a loop inductance per unit length of the signal wire, and c corresponds to a total capacitance per unit length of the signal wire, and wherein the means for adjusting includes means for changing a physical parameter of the wiring layout portion so that the wiring layout portion exhibits the rlc relationship.

18. A computer-implemented method of configuring a wiring layout in an integrated circuit design, comprising:

analyzing at least a portion of the wiring layout in the integrated circuit design, the wiring layout portion having a signal wire and one or more ground wires defined by multiple physical parameters; and adjusting one or more of the physical parameters in order to create non-negligible inductance effects in the wiring layout portion that are calculated to produce a desired time delay for signal propagation on the signal wire of the wiring layout portion, wherein the act of analyzing comprises determining a resistance of the wiring layout portion, representing a capacitance of the wiring layout portion as a function of the wire separation in a first function, representing an inductance of the wiring layout portion as a function of the wire separation in a second function, and calculating one or more wire separations using the first and second functions, the wire separations creating an rlc relationship between the signal wire and the one or more ground wires such that a desired time delay for signal propagation along the wiring layout portion is achieved, and wherein the act of adjusting comprises selecting one of the calculated wire separations and configuring the wiring layout portion using the selected wire separation.

19. The method of claim 18, wherein the selected wire separation creates an rlc relationship between the signal wire and the one or more ground wires of the wiring layout portion that minimizes signal propagation delay.

20. The method of claim 18, wherein the selected wire separation enables the signal wire to exhibit transmission-line behavior.

21. The method of claim 18, wherein the wiring layout is a clock tree.

22. A circuit having a wiring layout configured by the method of claim 18.

23. A computer-implemented method of configuring a wiring layout in an integrated circuit design, comprising:

analyzing at least a portion of the wiring layout in the integrated circuit design, the wiring layout portion having a signal wire and one or more ground wires defined by multiple physical parameters; and adjusting one or more of the physical parameters in order to create non-negligible inductance effects in the wiring layout portion that are calculated to produce a desired time delay for signal propagation on the signal wire of the wiring layout portion, wherein the act of analyzing comprises, partitioning the wider of either the signal wire or a selected one of the ground wires into segments having widths substantially equal to the width of the narrower of the signal wire or the selected one of the ground wires, the partitioning creating a remainder portion, calculating a mutual inductance between the narrower of the signal wire or the selected one of the ground wires and the segments, designating the remainder portion as the narrower of the signal wire or the selected one of the ground wires, and recursively repeating the partitioning, calculating, and designating until an inductance contribution from the remainder portion is negligible.

24. The method of claim 23, wherein the recursive repeating is performed to a recursion depth of four.

25. The method of claim 23, wherein the calculating includes calculating a geometric mean distance between the signal wire and at least a portion of the segments.

* * * * *